United States Patent [19]
Chou et al.

[11] Patent Number: 5,691,568
[45] Date of Patent: *Nov. 25, 1997

[54] WIRE BONDABLE PACKAGE DESIGN WITH MAXIUM ELECTRICAL PERFORMANCE AND MINIMUM NUMBER OF LAYERS

[75] Inventors: Tai-Yu Chou, Pleasanton; Sanjay Dandia, San Jose, both of Calif.

[73] Assignee: LSI Logic Corporation, Milpitas, Calif.

[*] Notice: The term of this patent shall not extend beyond the expiration date of Pat. No. 5,672,911.

[21] Appl. No.: 656,033

[22] Filed: May 31, 1996

[51] Int. Cl.$^6$ .................. H01L 23/52; H01L 23/48
[52] U.S. Cl. .................. 257/691; 257/698; 257/700
[58] Field of Search .................. 257/691, 698, 257/700, 692, 697

[56] References Cited

U.S. PATENT DOCUMENTS

| | | | |
|---|---|---|---|
| 4,551,746 | 11/1985 | Gilbert et al. | 257/691 |
| 4,551,747 | 11/1985 | Gilbert et al. | 257/691 |
| 5,089,881 | 2/1992 | Panicker | 257/691 |
| 5,218,230 | 6/1993 | Tamamura et al. | 257/691 |
| 5,513,076 | 4/1996 | Werther | 257/698 |

Primary Examiner—Mahshid D. Saadat
Assistant Examiner—S. V. Clark
Attorney, Agent, or Firm—Kevin L. Daffer; Conley, Rose & Tayon

[57] ABSTRACT

A semiconductor device package for one or more semiconductor dice having core circuits and input-output circuits uses a package substrate having one pair of biplanar conductive planes and another pair of biplanar conductive planes. The pairs of planes are positioned in a coplanar relationship between the package substrate top surface and bottom surface. The top surface has lands connected to the conductive planes and to the power bond pads for the core circuits and input-output circuits on the semiconductor die. The top surface has many top traces connected to the signal bond pads on the semiconductor die. The package substrate may have a die paddle connected to one land and/or thermal vias to conduct heat away from the semiconductor die. Power may be supplied to die core circuits through one pair of planes and to die input-output circuits through another pair of planes to decouple the core circuits from the input-output circuits and minimize noise induced false switching in either set of circuits. The core circuits and the input-output circuits may be powered by the same power supply or separate power supplies.

21 Claims, 24 Drawing Sheets

WIRE BONDABLE PACKAGE DESIGN WITH MAXIUM ELECTRICAL PERFORMANCE AND MINIMUM NUMBER OF LAYERS

CROSS REFERENCE TO RELATED PATENT APPLICATIONS

This patent application is related to U.S. patent application Ser. No. 08/655,599 filed concurrently herewith, and which is entitled "Apparatus To Decouple Core Circuits Power Supply From Input-Output Circuits Power Supply In A Semiconductor Device Package" by Sadanand R. Patil, Tai Yu Chou and Prubhansu Chukaibarti, and which is hereby incorporated by reference.

BACKGROUND OF THE INVENTION

FIELD OF THE INVENTION

The present invention relates generally to semiconductor packages, and, more particularly, to an apparatus for electrical power distribution connection of a semiconductor die in a semiconductor package.

DESCRIPTION OF THE RELATED TECHNOLOGY

In order to facilitate handling and connection of a semiconductor die to an external system, a common practice in the semiconductor industry is to package the die. Die packaging usually involves physically attaching and electrically connecting a semiconductor die to a package substrate to form a semiconductor device assembly. The package substrate can then be electrically connected to an external system (hereinafter the term "connect" or any word using the root word "connect," such as "connects," "connected," "connecting," "connection" or "connector" refer to electrical connections unless the context is specifically modified by another word, such as "thermal connection" or "mechanical connector").

A semiconductor die may be divided into two main parts: input-output circuits and core circuits. The input-output circuits receive all signals sent to the die from the external system, where the received signals are buffered by the input-output circuits and sent on to the core circuits. The core circuits process the received signals and generate resultant signals which are then sent back to the input-output circuits, where the resultant signals are buffered and transmitted back to the external system. In addition to receiving, processing, and returning signals, the input-output circuits and core circuits must be provided with direct current electric power. All signals and power enter and exit the semiconductor die through bond pads attached to the active face of the die.

A package substrate may be constructed from ceramic, printed circuit board (PCB, also known as primed wiring board or PWB) using epoxy laminates, or the like. The package substrate has a top surface (commonly referred to as a top surface and not indicative of orientation to external references), a central die receiving area on the top surface, conductive traces having bond fingers at their inner ends and located on the top surface surrounding the periphery of the die receiving area. The semiconductor die is centrally located in the die receiving area and the bond pads on the die are electrically connected using bond wires to the respective trace bond fingers on the package substrate. The traces typically connect to vias (plated through holes) or the like, which pass through the package substrate to another surface (commonly referred to as a bottom surface and not indicative of orientation to external references) opposite the top surface, where the vias exit the package substrate and connect to other traces which usually terminate in external connectors such as ball bumps, pins or the like (hereinafter external connectors). The completed semiconductor device assembly is connected to an external system where the package substrate acts as an intermediate pathway through which all signals and power pass to and from the die.

FIGS. 1, 2a, 2b, 3 and 4 illustrate typical prior art semiconductor device assemblies. FIG. 1 illustrates a prior art package substrate utilizing a single dielectric (or insulating) layer package substrate (hereinafter the term "insulate" or any word using the root word "insulate," such as "insulates," "insulated," "insulating," "insulation" or "insulator" refer to electrical insulation unless the context is specifically modified by another word, such as "thermal insulation" or "thermal insulator"). FIGS. 2a, 2b and 3 illustrate prior art package substrates utilizing three dielectric layers. FIG. 4 illustrates a prior art package substrate utilizing five dielectric layers.

Referring now to FIG. 1, a prior art semiconductor device assembly 100 is illustrated in schematic cutaway elevational view. Assembly 100 has a semiconductor die 102 and a package substrate 104. The package substrate 104 utilizes a single dielectric (or insulting) layer 106. The top surface 108 has a centrally located die receiving area 110 surrounded by top traces 112 (only two of many such top traces are shown for illustrative clarity). The semiconductor die 102 has bond pads 114 (only two of many such bond pads are shown for illustrative clarity) which electrically connect on a one to one basis with the top traces 112. Each of the top traces 112 electrically connect on a one to one basis to vias 116 (only five of many such vias are shown for illustrative clarity). The vias further electrically connect to respective bottom traces 118 (only five of many such bottom traces are shown for illustrative clarity) on the bottom surface 120, the bottom traces terminating in external connectors 122 (here illustrated as solder ball bumps, and only a few of many such external connectors are shown for illustrative clarity).

In this prior art package substrate 104, each semiconductor bond pad 114 is uniquely connected via a bond wire 115 to a dedicated pathway comprising a top trace 112, a via 116, a bottom trace 118 and an external connector 122. Only two of many such bond pads and bond wires are shown in FIG. 1 for illustrative clarity.

Therefore each bond pad on the semiconductor die used for connecting positive or negative voltages for power to the core circuits (not specifically illustrated), and each bond pad on the semiconductor die used for connecting positive or negative voltages for power to the input-output circuits (not specifically illustrated), as well as all of the semiconductor signal bond pads (not specifically illustrated), has an associated dedicated pathway.

As semiconductor die performance increases, parasitic inductances of the dedicated signal pathways and the dedicated positive and negative voltage power pathways (to either or both the core circuits and the input-output circuits) become significant. A way to minimize some of these parasitic inductances is to electrically connect all of the positive voltage power pathways to a first conductive plane which is positioned between the traces and the bottom traces, and to connect all of the negative voltage power pathways to a second conductive plane which is biplanar with the first conductive plane and is also positioned between the top traces and bottom traces (hereinafter the term "conduct" or any word using the root word "conduct,"

such as "conducts," "conducted," "conducting," "conduction," "conductive" or "conductor" refer to electrical conduction unless the context is specifically modified by another word, such as "thermal conduction" or "thermal conductor").

Referring now to FIGS. 2a and 2b, a prior art semiconductor device assembly 200 having first and second conductive planes 224a and 224b is illustrated. FIG. 2a is a schematic cutaway elevational view. FIG. 2b is a schematic partial cut out plan view where three quadrants 22, 23 and 24 of the semiconductor device assembly 200 have been carved out to successively greater depths (i.e. from the top surface to the bottom surface) for the purpose of illustration. Similar to assembly 100, assembly 200 has a semiconductor die 202 (illustrated only in FIG. 2a) and a package substrate 204. The package substrate 204 has a top surface 208 with a die receiving area 210 surrounded by top traces 212 (partially illustrated in quadrant 21 in FIG. 2b ), and a bottom surface 220 with bottom traces 218 and external connectors 222 (partially illustrated in quadrant 24 in FIG. 2b).

Unlike the assembly 100, assembly 200 has three dielectric layers 206a–c. The three dielectric layers 206a–c, respectively, electrically insulate the top traces 212 from the first conductive plane 224a, the first conductive plane 224a from the second conductive plane 224b, and the second conductive plane 224b from the bottom traces 218 and the external connectors 222. The first conductive plane 224a is partially illustrated in quadrant 22 in FIG. 2b, and the second conductive plane 224b is partially illustrated in quadrant 23 in FIG. 2b. The semiconductor die 202 has bond pads 214 (only two of many such bond pads are shown in FIG. 2a for illustrative clarity) which connect on a one to one basis with the top traces 212 using bond wires 226 (only two of many such bond wires are shown in FIG. 2a for illustrative clarity).

Each top trace 212e used to carry signals to or from the die 202 is connected on a one to one basis to a respective bottom trace 218e and external connector 222e by a signal via 216e (only one of many such signal vias are shown in FIG. 2a for illustrative clarity). The signal vias 216e pass through the three dielectric layers 206a–c, and through electrically insulating holes 228a and 228b respectively in the first and second conductive planes 224a and 224b.

All positive voltage power pathways connect to one conductive plane and all negative voltage power pathways connect to the other conductive plane. For example, each core circuit positive voltage power top trace 212a is connected to a via 216a which connects to the first conductive plane 224a. Each input-output circuit positive voltage power trace 212c is connected to a via 216c which also connects to the first conductive plane 224a. The first conductive plane 224a is further connected by via 216p to a bottom trace 218p and external connector 222p.

Each core circuit negative voltage power top trace 212b is connected to a via 216b which connects to the second conductive plane 224b. Each input-output circuit negative voltage power trace 212d is connected to a via 216d which also connects to the second conductive plane 224b. The second conductive plane 224b is further connected by via 216n to a bottom trace 218n and external connector 222n.

Although the package substrate 204 minimizes the parasitic inductances between the dedicated signal pathways and the positive and negative voltage power pathways, it has two disadvantages. First, as the quantity of core circuits and input-output circuits increase in modern semiconductor dies, the impact on ground bounce becomes increasingly important. If the noise generated by core circuit switching activity (referred to as core noise) and the noise generated by input-output simultaneous switching activity (referred to as simultaneous switching noise or SSN) becomes great enough, ground bounce can become pronounced enough that the use of common power planes may result in undesirable false switching in the core circuits and/or the input-output circuits.

Second, package substrate 204 does not provide a way to connect separate power sources to the core circuits and the input-output circuits. Separate power sources to the core circuits and the input-output circuits are desirable to minimize false switching due to ground bounce, and also when the core circuits require power at one voltage potential (for example 5 volts) and the input-output circuits require power at another voltage potential (for example 3.3 volts).

FIGS. 3 and 4 illustrate in schematic cutaway elevational views two prior art semiconductor device assemblies 300 and 400 respectively. Semiconductor device assemblies 300 and 400 both attempt to overcome the deficiencies of the package substrate 204 of assembly 200 by decoupling the core circuit power pathways from the input-output circuit pathways.

Referring now to FIG. 3, package substrate 304 decouples the core circuit power pathways from the input-output circuit power pathways by, for example, not electrically connecting the core circuit power pathways to either the first or second power planes 224a and 224b. Instead, each core circuit positive voltage power top trace 312a (not specifically illustrated) is connected to a via 316a which is connected a bottom trace 318a and external connector 322a, and each core circuit negative voltage power top trace 312b is connected to a via 316b which is connected a bottom trace 318b and external connector 322b. Although package substrate 304 minimizes the false switching associated with package substrate 204, the increased impedance on the core circuit power pathway can compromise the performance of the semiconductor die core circuits.

Referring now to FIG. 4, package substrate 404 decouples the core circuit power pathways from the input-output circuit power pathways by not electrically connecting the core circuit power pathways to either the first or second power planes 224a and 224b, but instead, by providing two additional power planes 424a and 424b and two additional dielectric layers 406a and 406b. Although package substrate 404 also minimizes the false switching associated with package substrate 204, the increased number of dielectric layers and power planes can make the package substrate 404 unacceptably thick, as well as, having increased manufacturing costs, and increased manufacturing defects thus reducing manufacturing yields.

In addition to the above, the continuous advance in semiconductor die technology over the past several years has provided a constant and dramatic increase in the number of circuits (i.e. circuit density) that can be incorporated into a semiconductor die of a given size. As the circuit density of a semiconductor die increases (hereinafter high density die), the number of bond pads on the high density die's active face must also increase.

In all of the foregoing illustrations, a common element is that the semiconductor die bond pads are connected to the traces in a one to one relationship. In order to package a high density die with an increased number of bond pads, a package substrate must also have a commensurate increase in traces so that the bond pads can be attached in a one to one relationship with the traces.

Unfortunately, semiconductor packaging technology has not been able to match the size reductions achieved in semiconductor die technology. Although packaging technology has been able to reduce both trace width and trace pitch, trace pitch has proven to be a limiting factor in package substrate design. As the number of semiconductor bond pads and associated package substrate traces increases, the solution has been to either move the bond finger ends of the traces (hereinafter traces) farther away from the periphery of the semiconductor die or to stagger the deployment of traces into multiple tiers surrounding the die. Either of these solutions requires the use of longer bond wires to interconnect the bond pads to the traces.

Unacceptable bond wire length can cause semiconductor device assemblies to experience catastrophic failures caused by bond wire shorting or breaking. Additionally, unacceptably long bond wire length can also reduce or hinder overall performance efficiency of the semiconductor device assembly. For example, at unacceptably long lengths, bond wire impedance can cause excessive voltage drops between the bond pads and the respective traces.

In light of the forgoing, what is needed is a semiconductor package substrate which will: minimize package substrate parasitic inductances between the dedicated signal pathways and both the core circuit and input-output circuit power pathways; minimize false switching in the semiconductor die core circuits and/or the input-output circuits; allow separate power sources, with substantially the same or different voltage potentials, to be connected to the core circuits and input-output circuits with minimum power pathway impedances; and allow an increased number of semiconductor die bond pads to be electrically interconnected to the package substrate while maintaining both a minimum number of required traces and a minimum bond wire lengths in the completed semiconductor device assembly.

SUMMARY OF THE INVENTION

OBJECTS OF THE INVENTION

An object of the present invention is to create a semiconductor device assembly where the semiconductor power bond pads are connected to package substrate ring lands and the semiconductor die signal bond pads are connected to package substrate traces.

Another object of the invention is to create a semiconductor device assembly with a package substrate having at least three dielectric layers and two or more pairs of conductive power planes which are connected to the package substrate ring lands. Three dielectric layers is the minimum number of layers one need in order to achieve optimized electrical performance for I/O circuits and core logic.

Another object of the present invention is to create a semiconductor device assembly where all of the top traces on the package substrate are utilized to connect to signal bond pads on the semiconductor die.

Another object of the present invention is to create a semiconductor device assembly where the power pathways have low impedance by keeping the bond wire lengths short.

Another object of the present invention is to create a semiconductor device assembly where the semiconductor die core circuits power pathways are connected to a first pair of biplanar conductive power planes and the input-output power pathways are connected to a second pair of biplanar conductive power planes, which further minimizes impedance in both the core circuit power pathways and the input-output power pathways.

Another object of the present invention is to create a semiconductor device assembly with a package substrate which minimizes ground bounce induced false switching in the semiconductor die core circuits and/or input-output circuits.

A novel feature of the present invention is the package substrate land ring and/or segmented ring patterns increase the flexibility of connecting the semiconductor die power bond pads to the package substrate lands with bond wires.

An advantage of the present invention is the ability to connect the semiconductor die core circuits to a first power supply having a voltage potential, and to connect the input-output circuits to another power supply having the same or a different voltage potential from the first power supply.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DISCLOSURE OF THE INVENTION

According to the present invention, the foregoing and other objects, advantages and features are attained by a semiconductor device assembly having a package substrate and one or more semiconductor dice. The package substrate has a top surface, a bottom surface and first and second conductive pattern. The top surface is separated from the first conductive pattern by a dielectric layer, the first conductive pattern is separated from the second conductive pattern by another dielectric layer, and the second conductive pattern is separated from the bottom surface by yet another dielectric layer.

The top surface has a die receiving area, a land area surrounding the die receiving area, a trace area surrounding the land area. The land area has first, second, third and fourth lands, and the trace area has many signal top traces. The first, second, third and fourth lands are insulated from one another and may be deployed in the land area in numerous configurations more fully described herein.

For example, in one configuration the first, second, third and fourth lands may be each subdivided into many noncontiguous segments. The first, second, third and fourth land segments are insulated from one another and may be arranged in a single-file segmented ring (.i.e. a ring formed of many noncontiguous insulated first, second, third and fourth land segments) encircling the die receiving area. The first, second, third and fourth land segments may be placed in any order in the ring as may be required to best provide bond wire locations for a particular semiconductor die (for instance, by way of illustration and not limitation, the land segments may be arranged as follows: a first land segment, a second land segment, a third land segment, a fourth land segment, another second land segment, another fourth land segment, another first land segment, another third land segment, etc. . . . ).

In an alterative configuration, for example, the first, second, third and fourth lands may be each subdivided into many noncontiguous segments. The first, second, third and fourth land segments are insulated from one another. The many first land segments and the many second land segments may be arranged in a first single-file segmented ring encircling the die receiving area. The many third land segments and the many fourth land segments may be arranged in a single-file segmented ring concentrically encircling the first single-file segmented ring.

In yet another configuration, for example, the first and second lands may be subdivided into many noncontiguous segments. The many first and second land segments are insulated from one another, and may be arranged in a single-file segmented ring encircling the die receiving area. The third land may be a contiguous ring and the fourth land may be a contiguous ring. The third and fourth land rings may be arranged as concentric rings which further concentrically encircle the segmented ring.

In still another configuration, for example, the first land may be a contiguous ring and the second land may be a contiguous ring. The first and second land rings may be arranged as concentric rings which encircle the die receiving area. The third and fourth lands may be subdivided into many noncontiguous segments. The many third and fourth land segments are insulated from one another, and may be arranged in a single-file segmented ring which further concentrically encircles the first and second contiguous rings.

In yet another configuration, for example, the first land may be a contiguous ring, the second land may be a contiguous ring, the third land may be a contiguous ring and the fourth land may be a contiguous ring. The first, second, third and fourth land rings may be arranged as concentric rings which encircle the die receiving area.

The bottom surface of the package substrate has many signal external connectors and one or more first power external connectors, one or more second power external connectors, one or more third power external connectors, and one or more fourth power external connectors.

The first conductive pattern has coplanar first and third conductive planes which are insulated from one another. The first conductive plane is connected to the first land (or many first land segments, as the case may be) and the one or more first power external connectors, and the third conductive plane is connected to the third land (or many third land segments, as the case may be) and the one or more third external connectors.

The second conductive pattern has coplanar second and fourth conductive planes which are insulated from one another. The second conductive plane is connected to the second land (or many second land segments, as the case may be) and the one or more second external connectors, and the fourth conductive plane is connected to the fourth land (or many fourth land segments, as the case may be) and the one or more fourth external connectors. The first and second planes are in a biplanar relationship, forming an electrical capacitance. The third and fourth planes are in a biplanar relationship, forming an electrical capacitance.

The one or more semiconductor dice each have core circuits, input-output circuits, and an active face with many signal bond pads, one or more first power bond pads for the core circuits, one or more second power bond pads for the core circuits, one or more third power bond pads for the input-output circuits, and one or more fourth power bond pads for the input-output circuits.

The one or more semiconductor dice are located in the die receiving area on the top surface of the package substrate. The many signal bond pads connect on a one to one basis to the many signal top traces, which connect to the many signal vias, which connect to the many bottom signal traces, which connect to the many signal external connectors, forming many signal pathways.

The one or more first power bond pads are connected to the first land (or to one or more first land segments, as the case may be), and the one or more second power bond pads are connected to the second land (or to one or more second land segments, as the case may be), thereby completing the electrical connection of the first and second power bond pads to the first and second power external connectors, respectively, and forming first and second core circuits power pathways.

The one or more third power bond pads are connected to the third land (or to one or more third land segments, as the case may be), and the one or more fourth power bond pads are connected to the fourth land (or to one or more fourth land segments, as the case may be), thereby completing the electrical connection of the third and fourth power bond pads to the third and fourth power external connectors, respectively, and forming third and fourth input-output circuit power pathways.

Because the first and second core circuits power pathways connect through the first and second conductive planes, respectively, and the third and fourth input-output circuits power pathways connect through the third and fourth conductive planes, respectively, the electrical power for the core circuits is decoupled from the electrical power for the input-output circuits. This decoupling minimizes false switching in the semiconductor die core circuits and/or the input-output circuits caused by core noise or simultaneous switching noise induced ground bounce. Further, because all of the power pathways connect through the conductive planes, all of the power pathways have minimized impedances, as well as minimized parasitic inductances of the signal pathways and the power pathways.

The one or more first power external connectors may be connected to a first voltage, and the one or more second power external connectors may be connected to a second voltage. The one or more third power external connectors may be connected to a third voltage, and the one or more fourth power external connectors may be connected to a fourth voltage. The first and second voltages are derived from a first power supply, and the third and fourth voltages may be derived from either the first power supply or a second power supply.

Whether connected to one or two power supplies, the first voltage may be negative with respect to the second voltage, and the third voltage may be negative with respect to the fourth voltage. If two power supplies are used, the first voltage and the third voltage may be connected together so that the voltage difference between the first voltage and the third voltage (as measured at the external connectors) is substantially zero volts. On the other hand the first voltage may be positive with respect to the second voltage, and the third voltage may be positive with respect to the fourth voltage. If two power supplies are used, the second voltage and the fourth voltage may be connected together so that the voltage difference between the second voltage and the fourth voltage (as measured at the external connectors) is substantially zero volts.

Whether connected to one or two power supplies, the voltage difference between the first voltage and the second voltage (as measured at the external connectors) may be substantially the same as the voltage difference between the third voltage and the fourth voltage (as measured at the external connectors). For example, the voltage difference between the first and second voltages may be between 4.5 volts to 5.5 volts, and the voltage difference between the third and fourth voltages may also be between 4.5 volts to 5.5 volts. Conversely, the voltage difference between the first and second voltages (as measured at the external connectors) may be substantially different from the voltage difference between third and fourth voltages (as measured at the external connectors). For example, the voltage difference between the first and second power external connectors may be between 4.5 volts to 5.5 volts, and the voltage difference between the third and fourth power external connectors may be between 2.5 volts to 4.0 volts, or visa-versa.

A thermally conductive die paddle is located in the die receiving area of the package substrate. The inactive face of the semiconductor die may be attached to the die paddle with a thermally conductive adhesive. The die paddle may extend out of the die receiving area into the land area and connect to a single land (or to one or more segments of the land).

The die paddle may also be thermally connected to thermal vias which pass from the package substrate top surface to the package substrate bottom surface. At the bottom surface the thermal vias may terminate in a heat sink such as a thermal radiator and/or thermal external connectors.

Other and further objects, features and advantages will be apparent from the following description of the presently preferred embodiments of the invention, given for the purpose of disclosure and taken in conjunction with the accompanying drawings.

DETAILED DESCRIPTION OF PREFERRED EMBODIMENTS

Figure 1:
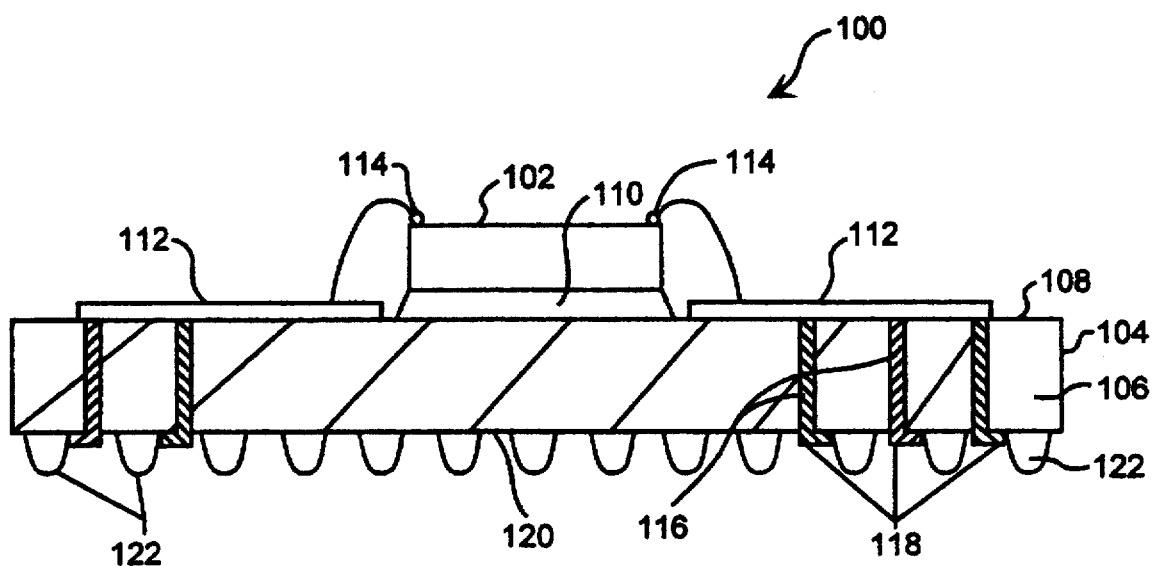
FIG. 1 is a schematic cutaway elevational view of a prior art semiconductor device assembly.
Figure 2A:
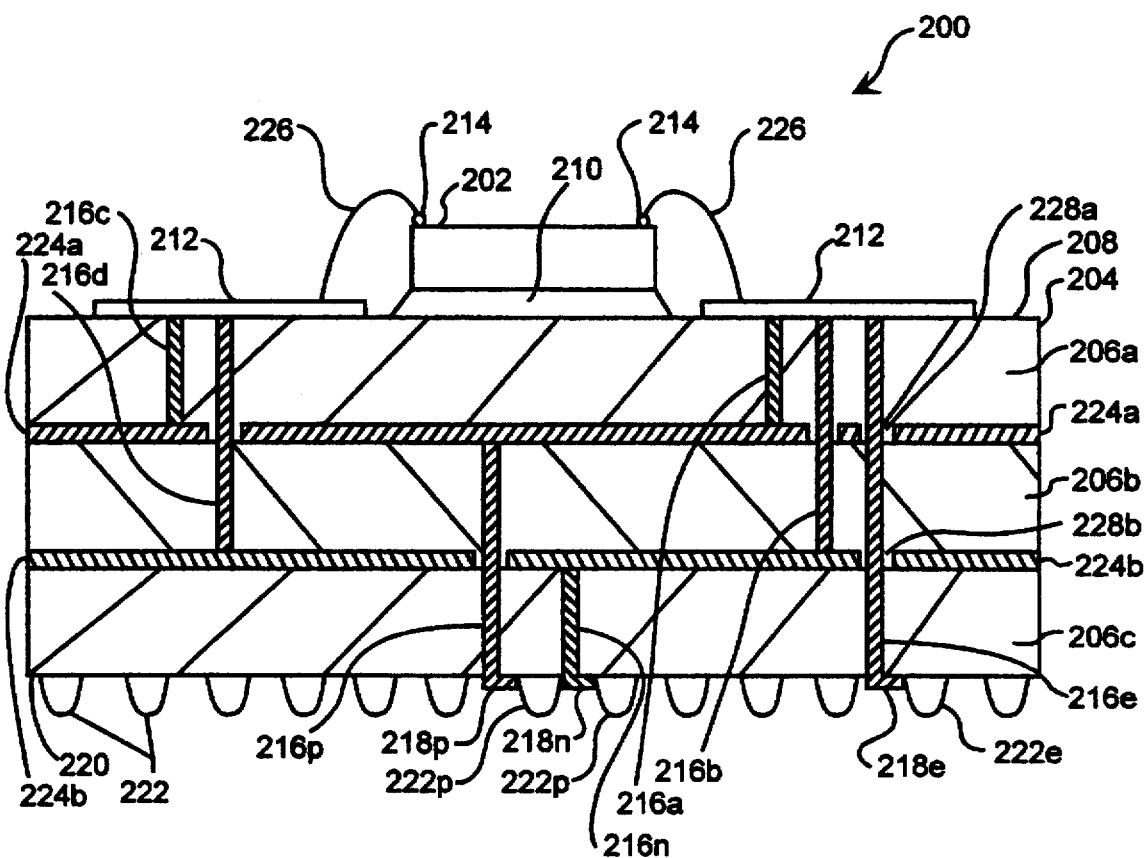
FIG. 2a is a schematic cutaway elevational view of a prior art semiconductor device assembly.
Figure 2B:
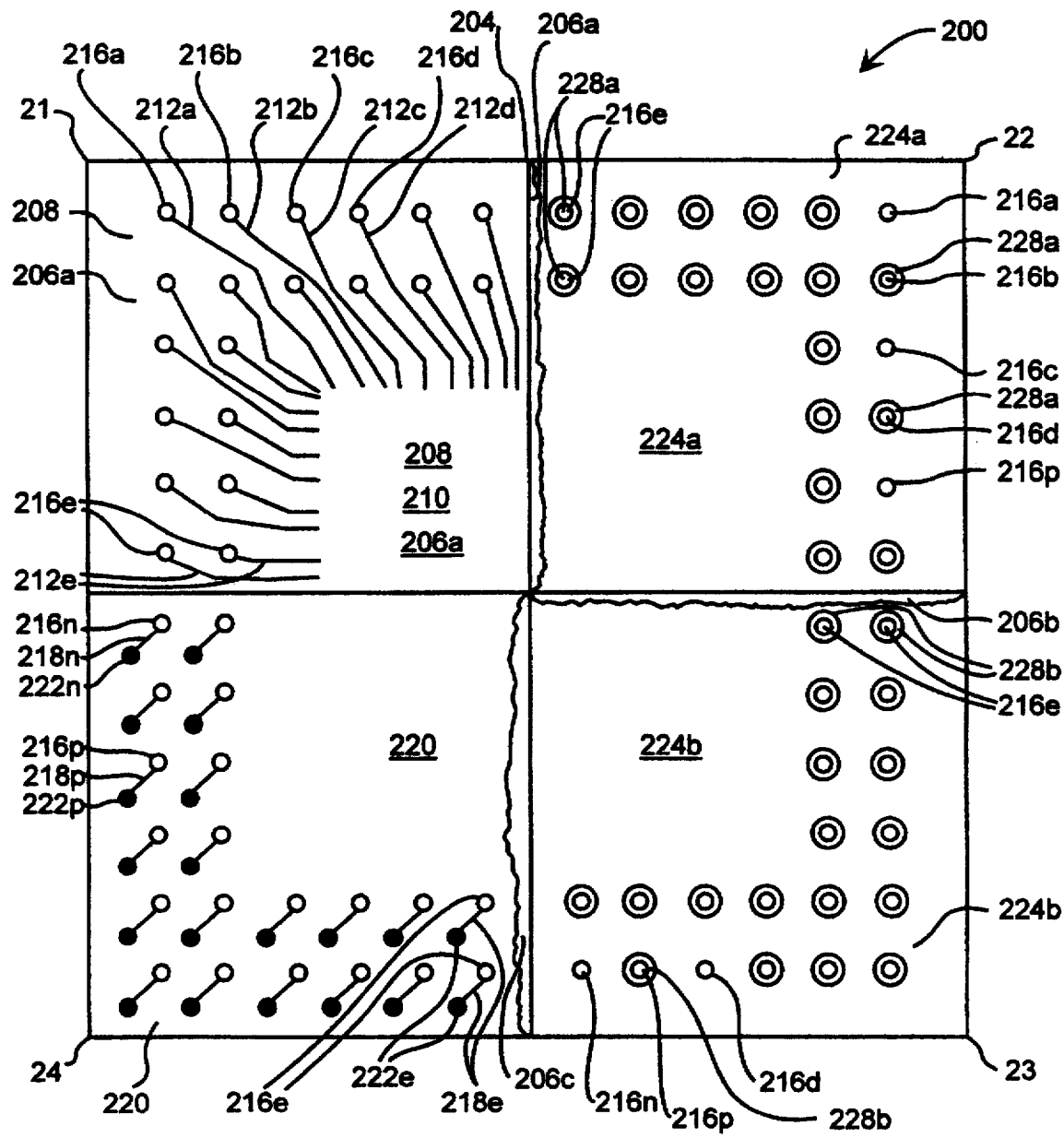
FIG. 2b is a schematic partial cut out plan view of a prior art semiconductor device assembly.
Figure 3:
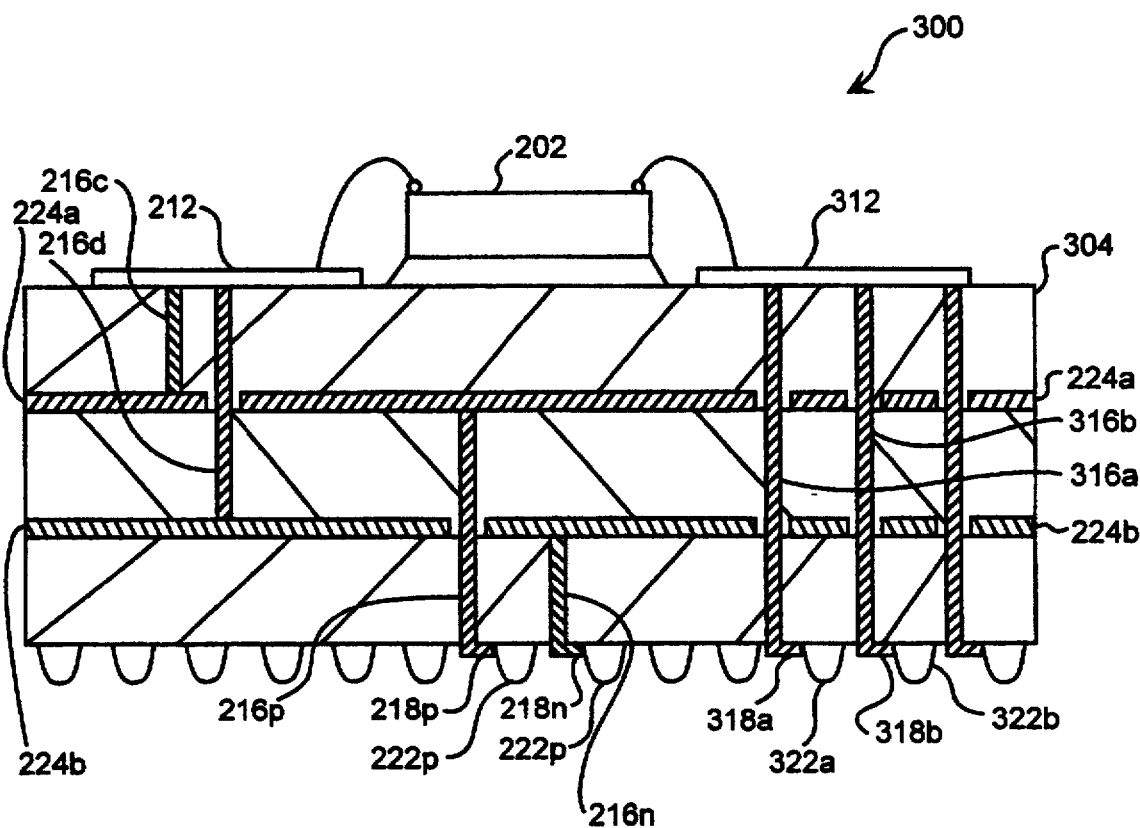
FIG. 3 is a schematic cutaway elevational view of a prior art semiconductor device assembly.
Figure 4:
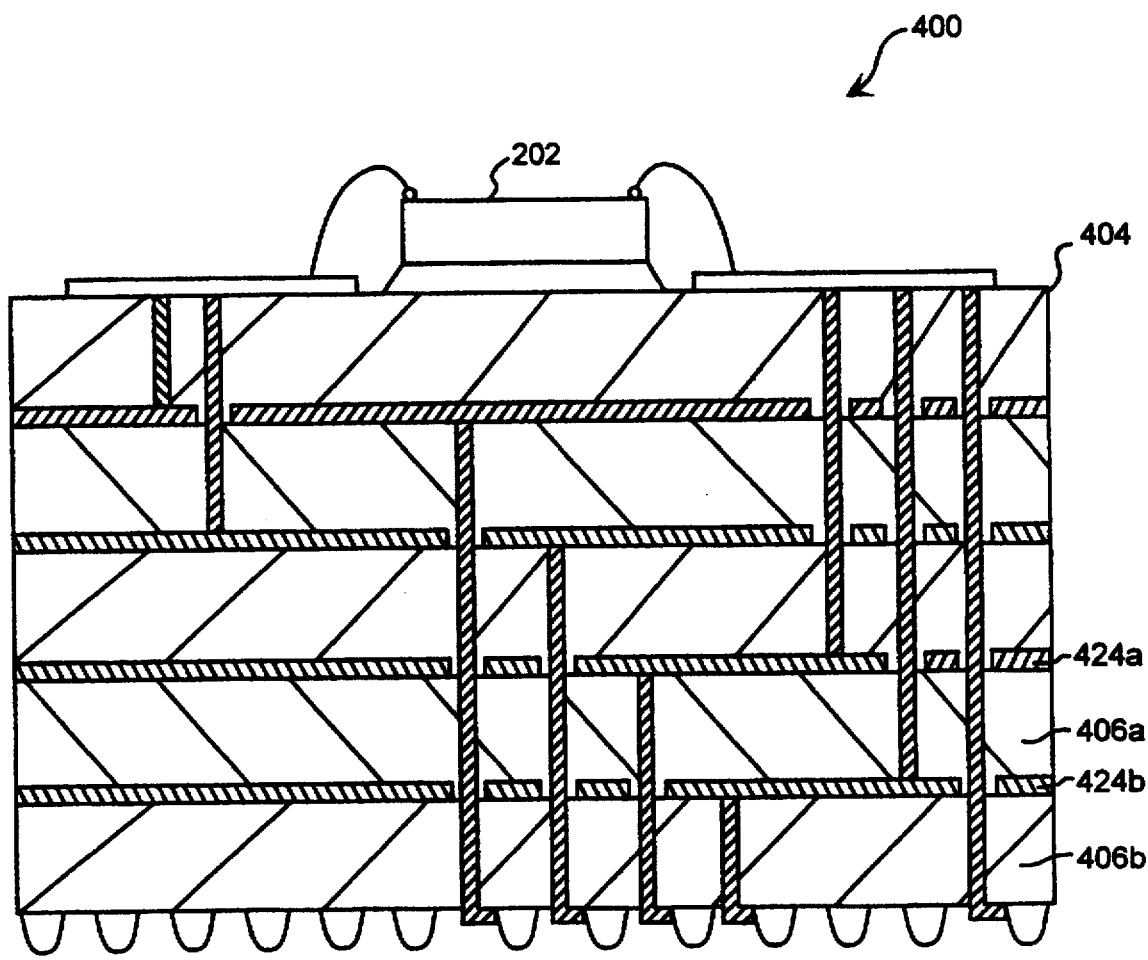
FIG. 4 is a schematic cutaway elevational view of a prior art semiconductor device assembly.

A better understanding of the present invention will be obtained when the following detailed description is read with reference to the drawings. In the drawings like elements are numbered the same, and similar elements are represented by the same number and a different lower case letter suffix.

Figure 5A:
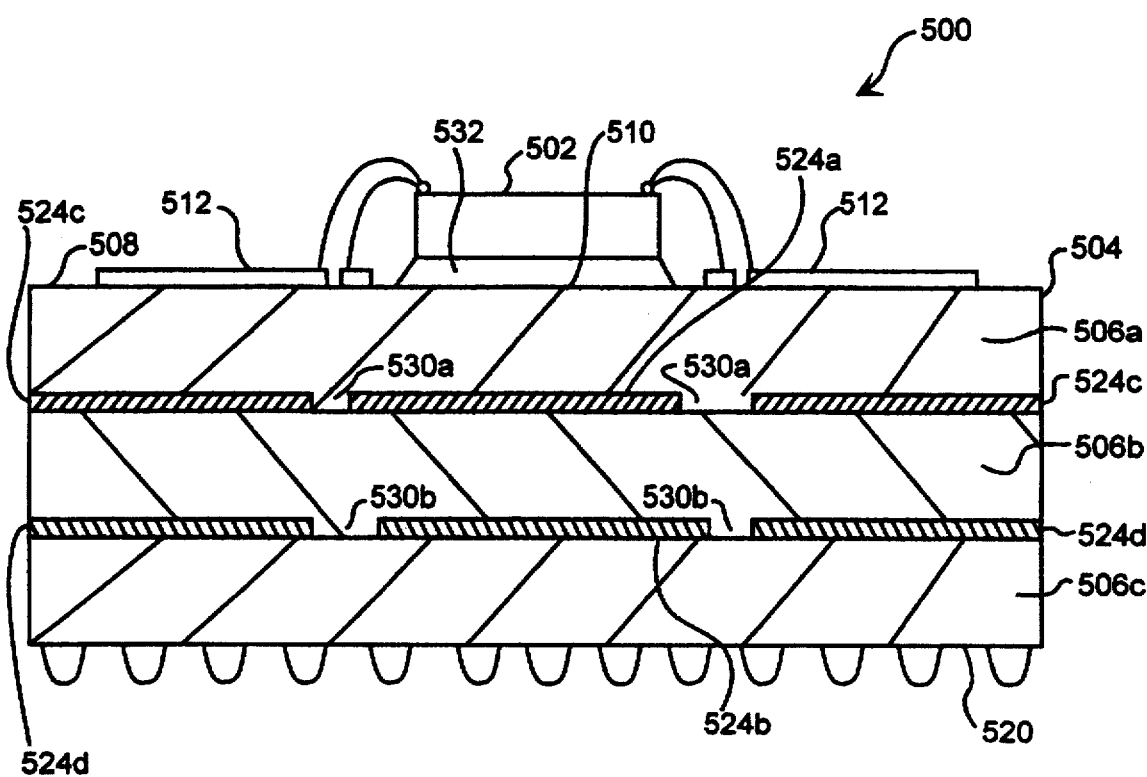
FIGS. 5a, 5b and 5c are three schematic cutaway elevational views of the present invention.
Figure 5B:
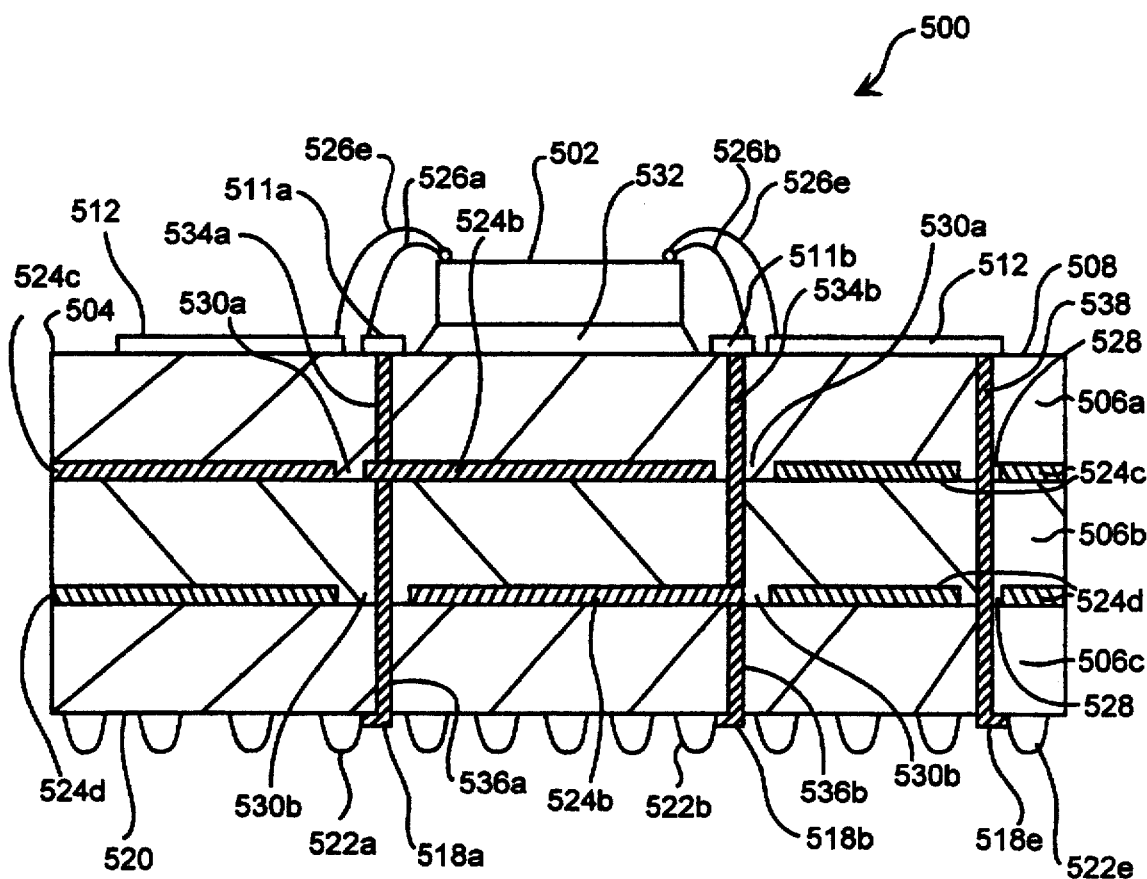
Figure 5C:
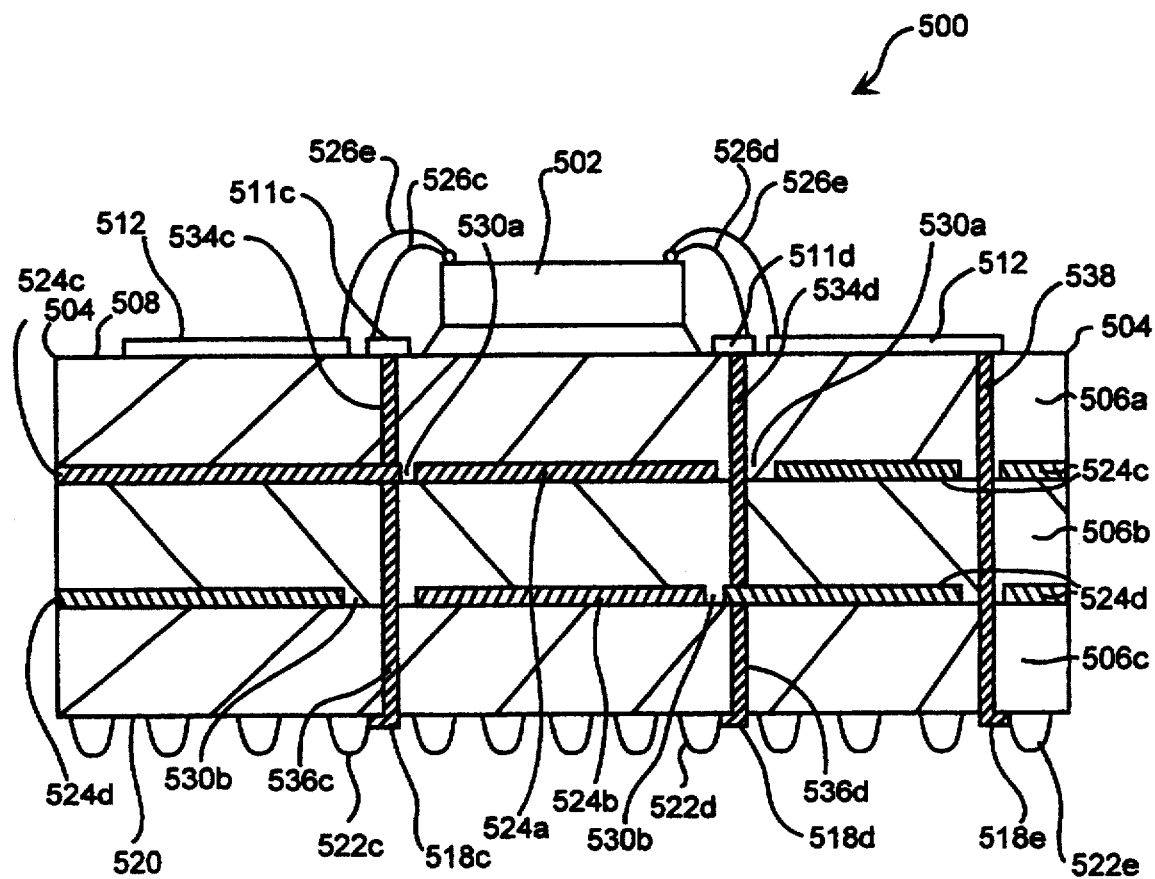

Referring now to FIGS. 5a, 5b, 5c, 5d, 5e, 5f and 5g a preferred embodiment of the of the present invention is illustrated. FIGS. 5a, 5b and 5c illustrate the present invention in three different schematic cutaway elevational views. FIG. 5a shows the present invention where, for the purpose of illustration, the view of the conductive planes is unobstructed by the view of vias. FIG. 5b shows how the first pair of biplanar conductive planes are integrated with the vias. FIG. 5c shows how the second pair of biplanar conductive planes are integrated with the vias.

Figure 5D:
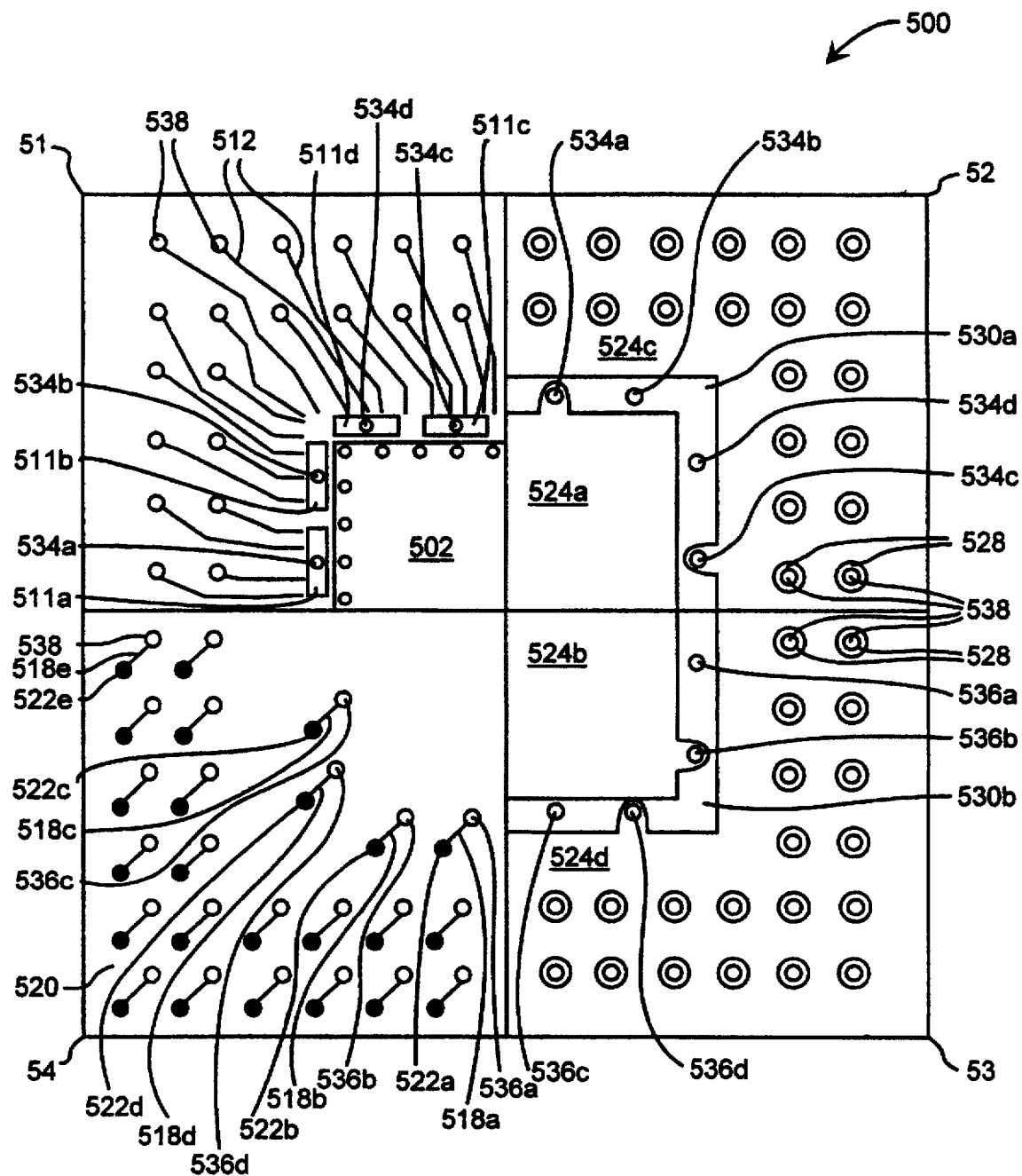
FIG. 5d is a schematic partial cut out plan view of the present invention.

FIG. 5d illustrates the present invention in schematic partial cut out plan view where three quadrants 52, 53 and 54 of the semiconductor device assembly 500 have been carved out to successively greater depths (i.e. from the top surface to the bottom surface) for the purpose of illustration.

Figure 5E:
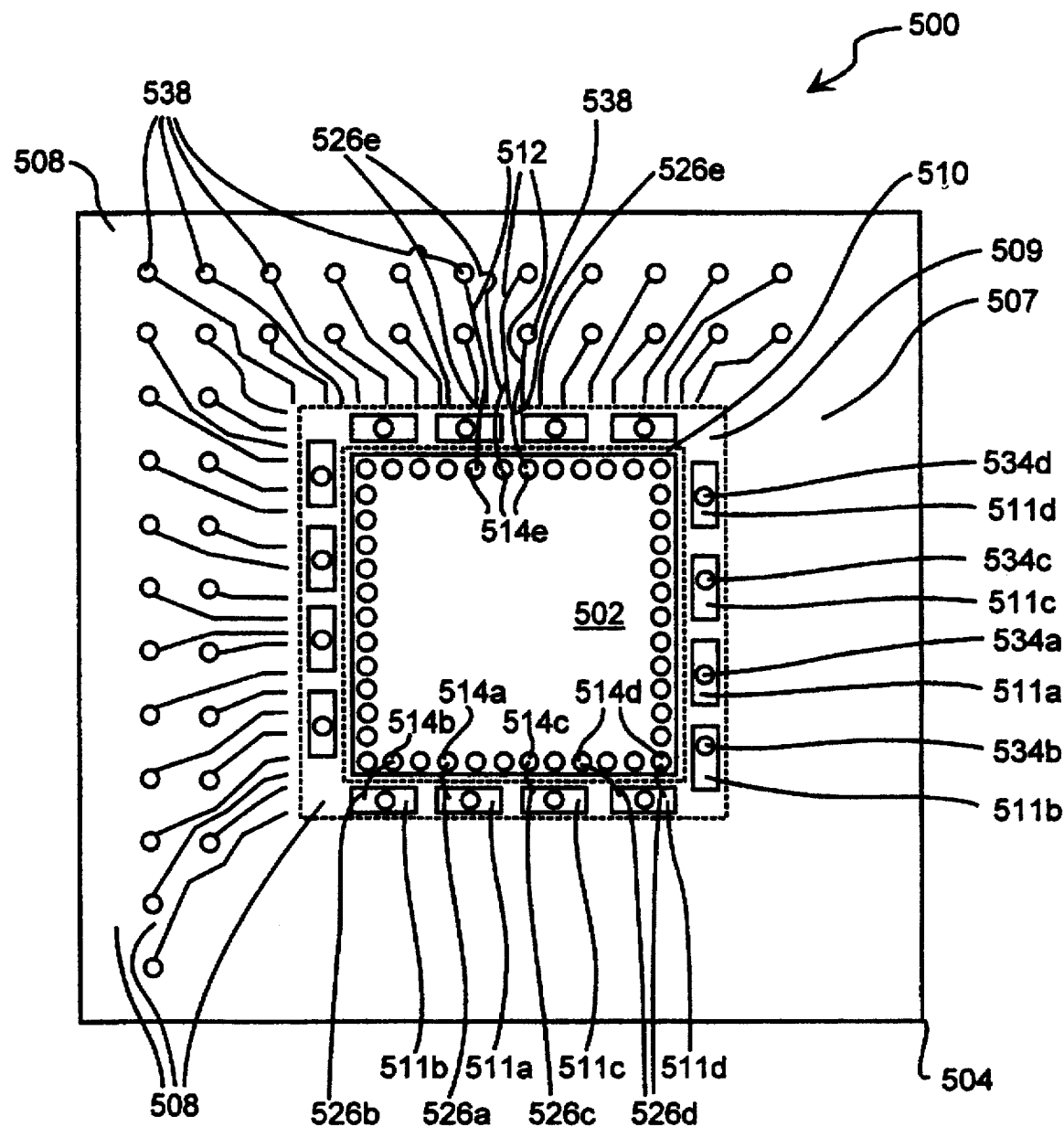
FIG. 5e is a schematic plan view of the present invention.
Figure 5F:
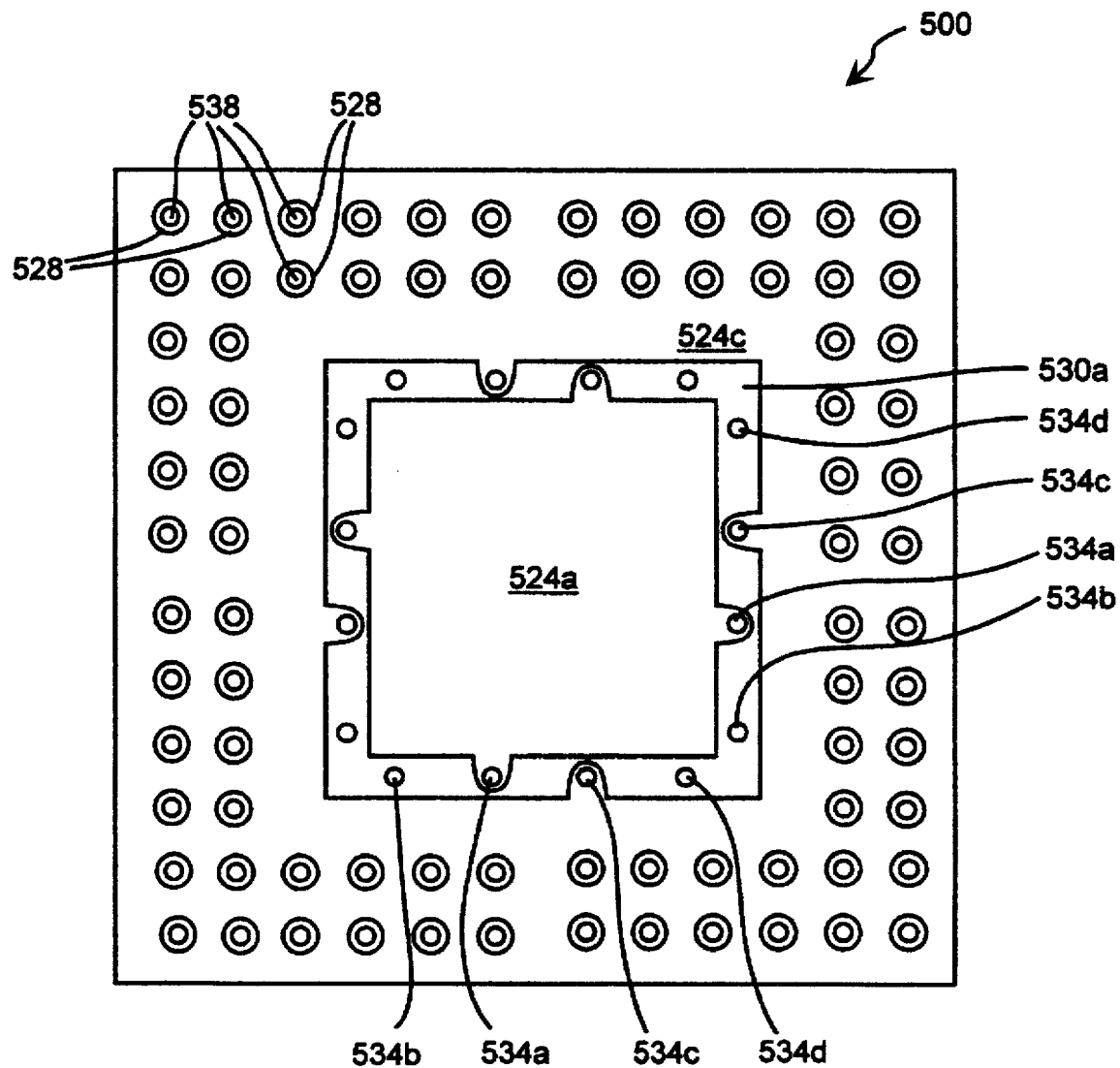
FIGS. 5f and 5g are two schematic cut out plan views of the present invention.
Figure 5G:
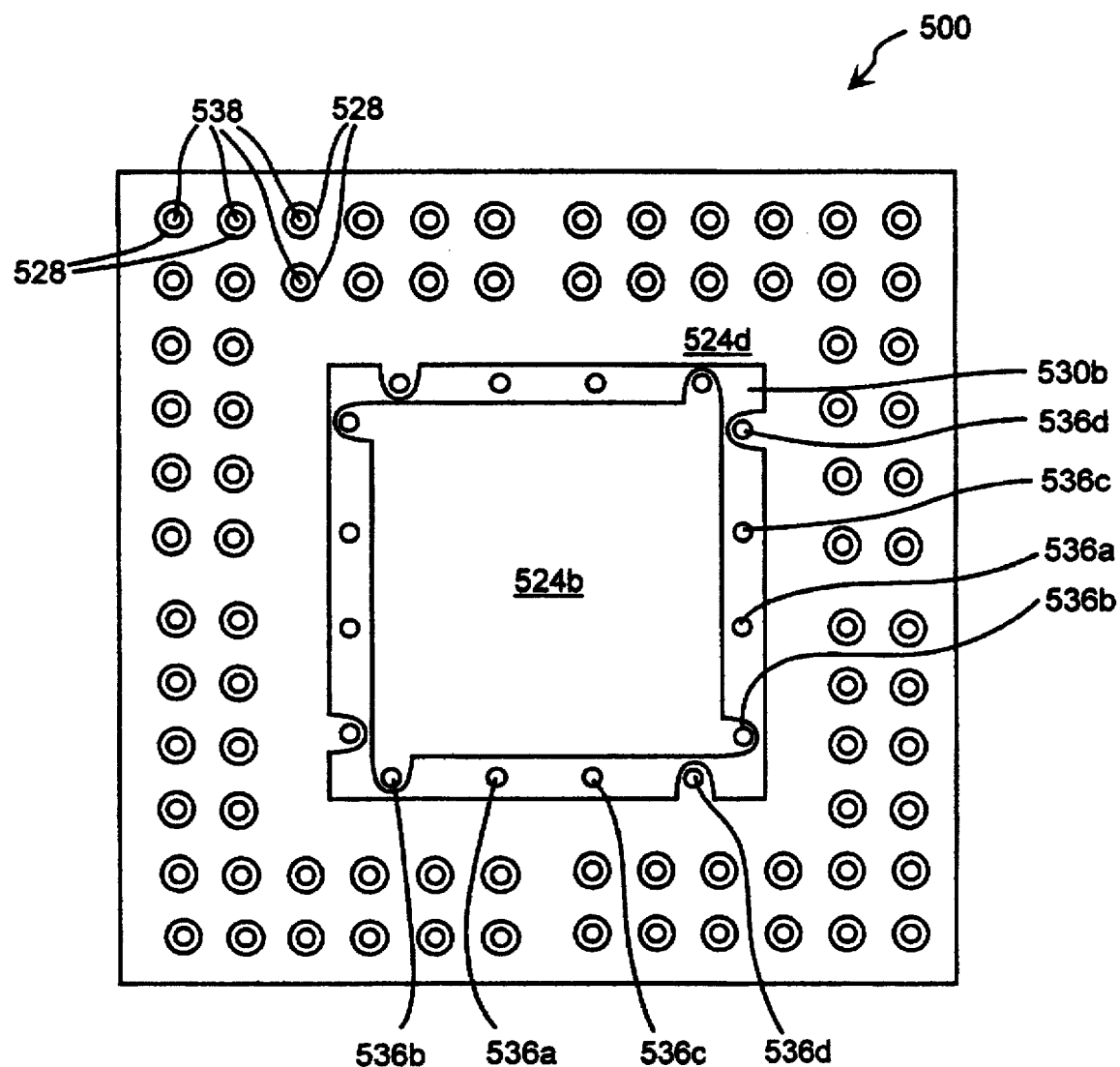

FIG. 5e illustrates the present invention in a plan view. FIGS. 5f and 5g illustrate the present invention in two schematic cut out plan views. FIG. 5f shows the present invention where, for the purpose of illustration, the first dielectric layer 506a has been cut out to expose the first conductive pattern. FIG. 5g shows the present invention where, for the purpose of illustration, the first and second dielectric layers 506a and 506b have been cut out to expose the second conductive pattern.

Semiconductor device assembly 500 has a semiconductor die 502 and a package substrate 504. The package substrate 504 has a top surface 508 with a die receiving area 510 encircled by lands 511a–d, which are further encircled by signal top traces 512 (partially illustrated in FIG. 5e for illustrative clarity), and a bottom surface 520 with bottom traces 518a–e and external connectors 522a–e (partially illustrated in quadrant 54 in FIG. 5d). The lands 511a–d, the signal top traces 512 and the bottom traces 518a–e may be fabricated from gold alloys, aluminum alloys, copper alloys or the like. The external connectors 522a–e may be solder ball bumps (illustrated), pins (not illustrated) or the like.

As best viewed in FIG. 5d and 5e, the first, second, third, and fourth lands 511a–d are each subdivided into many noncontiguous segments. The many land segments 511a–d may be selectively arranged into a single file ring (best illustrated in FIG. 5e) in a land area 509 (represented as the annular area between the two dashed lines in FIG. 5e) surrounding die receiving area 510 (represented as the area inside the inner dashed line in FIG. 5e). The signal top traces 512 are selectively arranged in the trace area 507 (represented as the area outside the outer dashed line in FIG. 5e) surrounding the land area 509. The many land segments 511a–d and the many signal top traces 512 are all insulated from one another by the package substrate top surface 508.

As best viewed in FIGS. 5a, 5b, 5c and 5e, the semiconductor die 502 is located on the package substrate 504 in the die receiving area 510. The die 502 may be mechanically attached to the package substrate 504 in the die receiving area 510 using epoxy 532 or the like.

As best viewed in FIG. 5e, the die 502 has core circuits (not illustrated), inputs-output circuits (not illustrated), first power bond pads 514a for the core circuits, second power bond pads 514b for the core circuits, third power bond pads 514c for the input-output circuits, fourth power bond pads 514d for the input-output circuits, and signal bond pads 514e.

The first, second, third, and fourth power bond pads 514a–d (only a few of many such bond pads are shown for illustrative clarity) are connected to the first, second, third, and fourth land segments 511a–d, respectively, (only a few of many such bond pads are shown for illustrative clarity) using bond wires 526a–d, respectively (only a few of many such bond pads are shown for illustrative clarity).

A single power bond pad may be connected to a single land segment (such as is illustrated in FIG. 5e where a single power bond pad 514a is connected to a single land segment 511a using a bond wire 526a), or two or more power bond pads may be connected to a single land segment (such as is illustrated in FIG. 5e where two power bond pads 514d are connected to a single land segment 511d using two bond wires 526d).

The land segments 511a–d may be selectively arranged in the ring in any sequential order which will best suit the bond wires 526a–d used to interconnect the bond pads 514a–e to the land segments 511a–d and the signal top traces 512. Although not illustrated, it is contemplated that, without departing from the spirit of the present invention, the land segments 511a–d may be selectively sized, in either length or width, so as to best suit the bond wires 526a–d. Further the land segments may be of irregular shape and dimension to best suit the design requirements for a given design application.

The signal bond pads 514e (only a few of many such bond pads are shown for illustrative clarity) usually connect on a one to one basis with the signal top traces 512, respectively (only a few of many such top traces are shown for illustrative clarity), using bond wires 526e (only a few of many such bond wires are shown for illustrative clarity).

In FIGS. 5a, 5b, 5c, 5d, 5f and 5g, assembly 500 further has three dielectric layers 506a,b,c (best viewed in FIG. 5a), a first conductive pattern comprising first and third conductive planes 524a and 524c (best viewed in FIGS. 5a and 5f, and partially illustrated in quadrant 52 in FIG. 5d), and a second conductive pattern comprising second and fourth conductive planes 524b and 524d (best viewed in FIGS. 5a and 5g, and partially illustrated in quadrant 53 in FIG. 5d). Dielectric layer 506a insulates the land segments 511a–d and the signal top traces 512 from the first and third conductive planes 524a and 524c. Dielectric layer 506b insulates the first and third conductive planes 524a and 524c from the second and fourth conductive planes 524b and 524d. And dielectric layer 506c insulates the second and fourth conductive planes 524b and 524d from both the bottom traces 518a–e and the external connectors 522a–e. The dielectric layers 506a,b,c may be fabricated from epoxy, polyimide, fiberglass reinforced plastic, ceramic or the like. The conductive planes may be fabricated from gold alloys, aluminum alloys, copper alloys or the like.

The first and third conductive planes 524a and 524c are electrically separated from each other by an insulating gap 530a. Preferably the first conductive plane 524a is an island centrally located within, and encircled by, the third conductive plane 524c (best viewed in FIG. 5f). Similarly, second and fourth conductive planes 524b and 524d are electrically separated from each other by another insulating gap 530b. Preferably the second conductive plane 524b is an island centrally located within, and encircled by, the fourth conductive plane 524d (best viewed in FIG. 5g).

As best viewed in FIGS. 5b, 5c and 5d, each signal top trace 512 used to carry signals to or from the die 502 is connected on a one to one basis to a respective bottom trace 518e and an external connector 522e by a signal via 538 (only one of many such signal vias 538 are shown in FIGS. 5b and 5c for illustrative clarity). The signal vias 538 pass through the three dielectric layers 506a,b,c, and pass through electrically insulating holes 528 in the third and fourth conductive planes 524c and 524d.

As best viewed in FIG. 5b, the first conductive plane 524a is connected to the first land segments 511a by top vias 534a, and the first conductive plane is also connected to the bottom traces 518a by bottom vias 536a forming a first power pathway which connects the first power bond pads 514a to the external connectors 522a. The second conductive plane 524b is connected to the second land segments 511b by top vias 534b, and the second conductive plane is also connected to the bottom traces 518b by bottom vias 536b forming a second power pathway which connects the second power bond pads 514b to the external connectors 522b.

As best illustrated in FIGS. 5b and 5d, the top vias 524b pass through the insulating gap 530a in the first conductive pattern, and the bottom vias 526a pass through the insulating gap 530b in the second conductive pattern. Although not illustrated, it is contemplated that, without departing from the spirit of the present invention, the first and second conductive planes 524a and 524b may each have insulated holes (analogous to insulating holes 528) through which top vias 524b and bottom vias 526a may respectively pass.

The first and second conductive planes 524a and 524b, in a biplanar relationship and separated by dielectric layer 506b, form a first pair of conductive planes which form an electrical capacitance when a first voltage is applied to the external connectors 522a and a second voltage is applied to the external connectors 522b.

As best viewed in FIG. 5c, the third conductive plane 524c is connected to the third land segments 511c by top vias 534c, and the third conductive plane is also connected to the bottom traces 518c by bottom vias 536c forming a third power pathway which connects the third power bond pads 514c to the external connectors 522c. The fourth conductive plane 524d is connected to the fourth land segments 511d by top vias 534d, and the fourth conductive plane is also connected to the bottom traces 518d by bottom vias 536d forming a fourth power pathway which connects the fourth power bond pads 514d to the external connectors 522d.

As best illustrated in FIGS. 5c and 5d, the top vias 524d pass through the insulating gap 530a in the first conductive pattern, and the bottom vias 526c pass through the insulating gap 530b in the second conductive pattern. Although not illustrated, it is contemplated that, without departing from the spirit of the present invention, the third and forth conductive planes 524c and 524d may each have insulated holes (analogous to insulating holes 528) through which top vias 524d and bottom vias 526c may respectively pass.

The third and fourth conductive planes 524c and 524d, in a biplanar relationship and separated by dielectric layer 506b, form a second pair of conductive planes which form an electrical capacitance when a third voltage is applied to the external connectors 522c and a fourth voltage is applied to the external connectors 522d.

The signal vias 538, the top vias 534a–d, and the bottom vias 536a–d, are preferably plated through holes, and may be fabricated from gold alloys, aluminum alloys, copper alloys or the like.

As illustrated in this embodiment, by connecting the land segments 511a–d to the conductive planes 524a–d, respectively, the semiconductor die 502 first and second power bond pads 514a and 514b for the core circuits are decoupled from the third and fourth power bond pads 514c and 514d for the input-output circuits, thereby reducing noise induced false switching in the core circuits and/or the input-output circuits. Although not illustrated, it is contemplated that, without departing from the spirit of the present invention, the core circuits first and second power bond pads 514a and 514b may be alternatively connected to the third and fourth conductive planes 524c and 524d, respectively, and the input-output circuits third and fourth power bond pads 514c and 514d may be alternatively connected to the first and second conductive planes 524a and 524b.

In FIGS. 5b through 5g, for clarity of illustration, the top vias 534a–d were located directly above, and aligned with, the corresponding bottom vias 536a–d (e.g. a top via 534a shared a common axis with a bottom via 536a )(also known as "through vias"). Although not illustrated, it is contemplated that, without departing from the spirit of the present invention, the top vias 534a–d may be located so as to not be directly above, or aligned with, the corresponding bottom vias 536a–d (e.g. a top via 534a will not share a common axis with a bottom via 536a)(also known as "blind vias"). It is contemplated, and within the spirit of the present invention that a package substrate may have both through vias as illustrated in FIG. 5b (e.g. 534a–d and 536a–d) and blind vias (not illustrated).

Figure 6A:
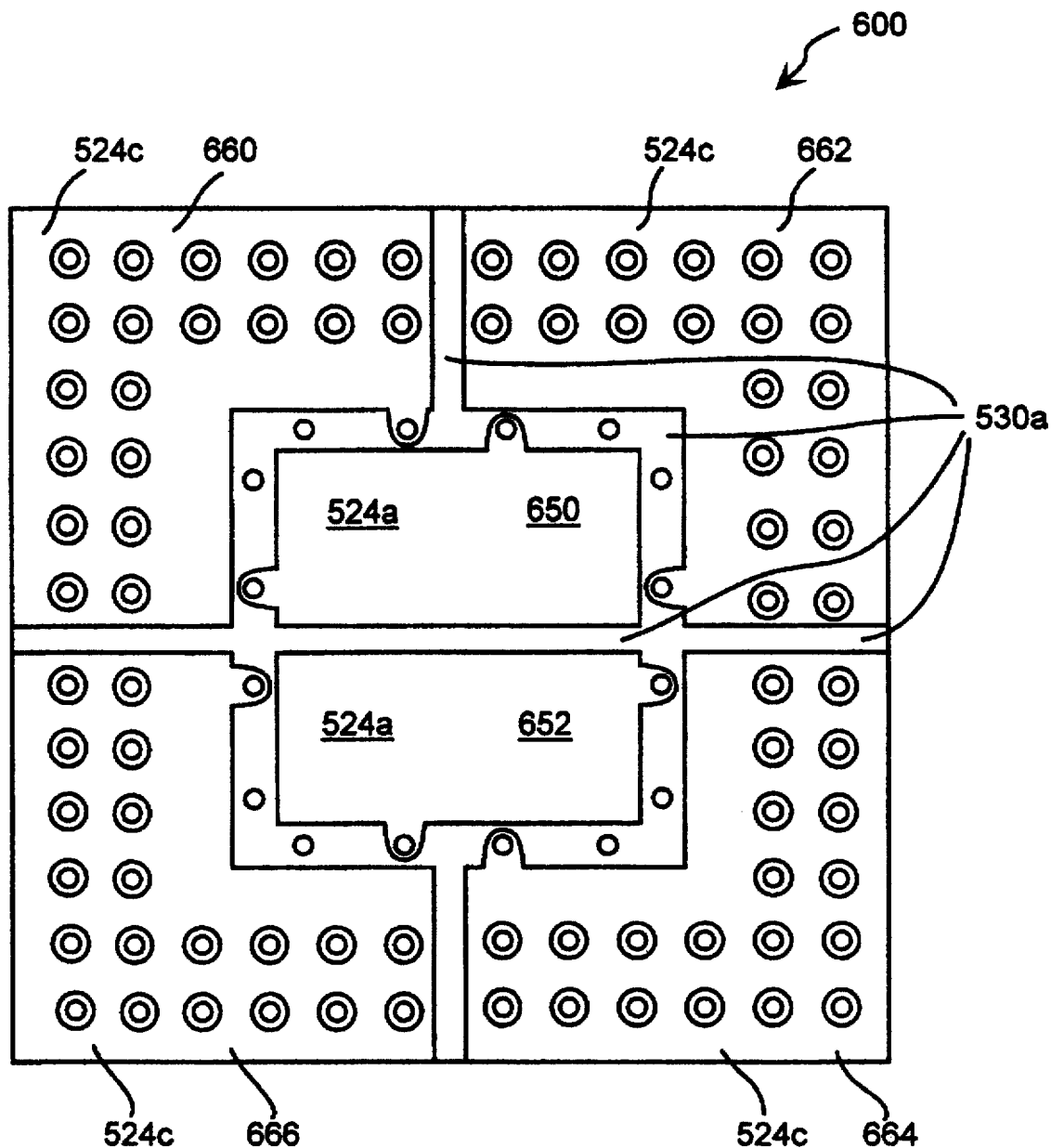
FIGS. 6a and 6b are two schematic cut out plan views of an aspect of the present invention.
Figure 6B:
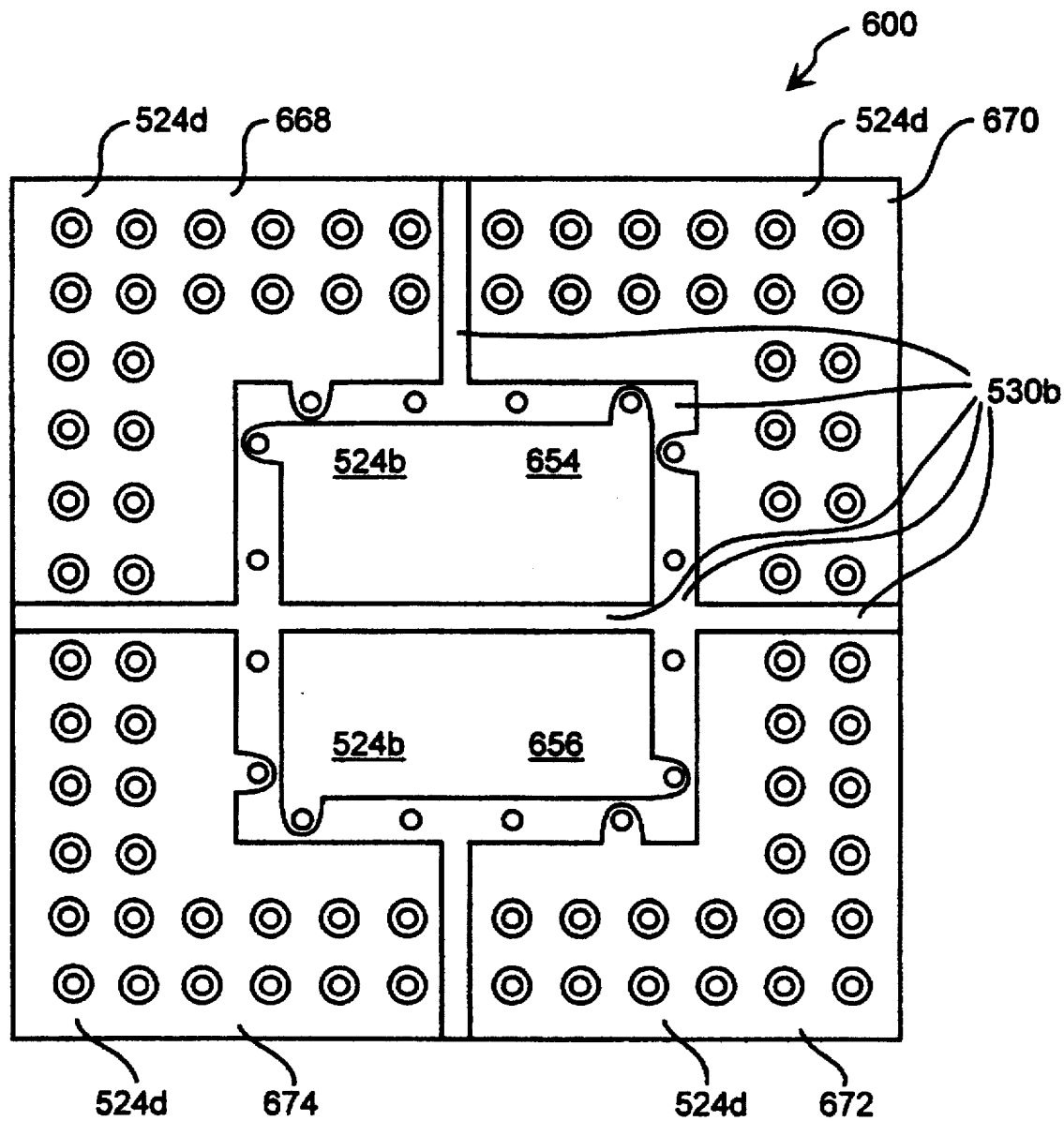

Although assembly 500 was shown, for the purpose of illustrative clarity, as having the same number of top vias 534a–d as bottom vias 536a–d, it is contemplated, and within the spirit of the present invention, that a package substrate 504 may have a greater number, the same number, or a lesser number of top vias 534a–d than bottom vias 536a–d. The quantity and placement of the top vias 534a–d will be dictated by the quantity and location of power bond pads 514a–d on the semiconductor die (and therefore the quantity and location of land segments 511a–d on the package substrate 504), whereas the quantity and placement of the bottom vias 536a–d will be dictated by the requirements of the external system. Although assembly 500 was shown, for the purpose of illustrative clarity, as having substantially square, or rectangular shaped, first, second, third, and fourth conductive planes 524a–d, it is contemplated, and within the spirit of the present invention, that the conductive planes not be limited to square, or rectangular, shapes. Referring now to FIGS. 6a and 6b, an aspect of the present invention is illustrated in schematic cut out plan view. For the purpose of illustration, assume the die, bond pads, bond wires, land segments, signal top traces, top vias, bottom vias, signal vias, dielectric layers, bottom traces, and external connectors in assembly 600 are identical to the die 502, bond pads 514a–e, bond wires 526a–e, land segments 511a–d, signal top traces 512, top vias 534a–d, bottom vias 536a–d, signal vias 538, dielectric layers 506a–c, bottom traces 518a–e, and external connectors 522a–e in assembly 500 (as illustrated in FIGS. 5a through 5g). FIG. 6a shows the aspect of the present invention where, for the purpose of illustration, the first dielectric 506a has been cut out to expose the first conductive pattern. FIG. 6b shows the present invention where, for the purpose of illustration, the first and second dielectric layers 506a and 506b have been cut out to expose the second conductive pattern.

Should it be desirable to isolate some core circuits from other core circuits, and/or some input-output circuits from other input-output circuits in the semiconductor die 502, the biplanar pair of first and second conductive planes 524a and 524b, and/or the biplanar pair of third and fourth conductive planes 524c and 524d may be subdivided into electrically separate biplanar pairs of subplanes. Such biplanar subplane pairs can further minimize ground bounce and noise induced false switching in the core circuits and/or the input-output circuits.

For example, FIG. 6a shows how the first conductive plane 524a may be subdivided into two electrically separate subplanes 650 and 652, and the third conductive plane 524c may be subdivided into four electrically separate subplanes 660, 662, 664, 666, by selectively extending the insulating gap 530a (which serves to electrically separate the first and third conductive planes 524a and 524c) into the selected conductive planes. FIG. 6b shows how the second conductive plane 524b may be subdivided into two electrically separate subplanes 654 and 656 (respectively forming biplanar pairs with conductive subplanes 650 and 652), and the fourth conductive plane 524d may be subdivided into four electrically separate subplanes 668, 670, 672, 674 (respectively forming biplanar pairs with conductive subplanes 660, 662, 664 and 666), by selectively extending the insulating gap 530b (which serves to electrically separate the first and third conductive planes 524b and 524d) into the selected conductive planes.

It is contemplated, and within the spirit of the present invention, that the biplanar pair of first and second conductive planes 524a and 524b, and the biplanar pair of third and fourth conductive planes 524c and 524d may be subdivided into two or more biplanar pairs of subplanes as may be required for the specific application of the present invention.

Figure 7A:
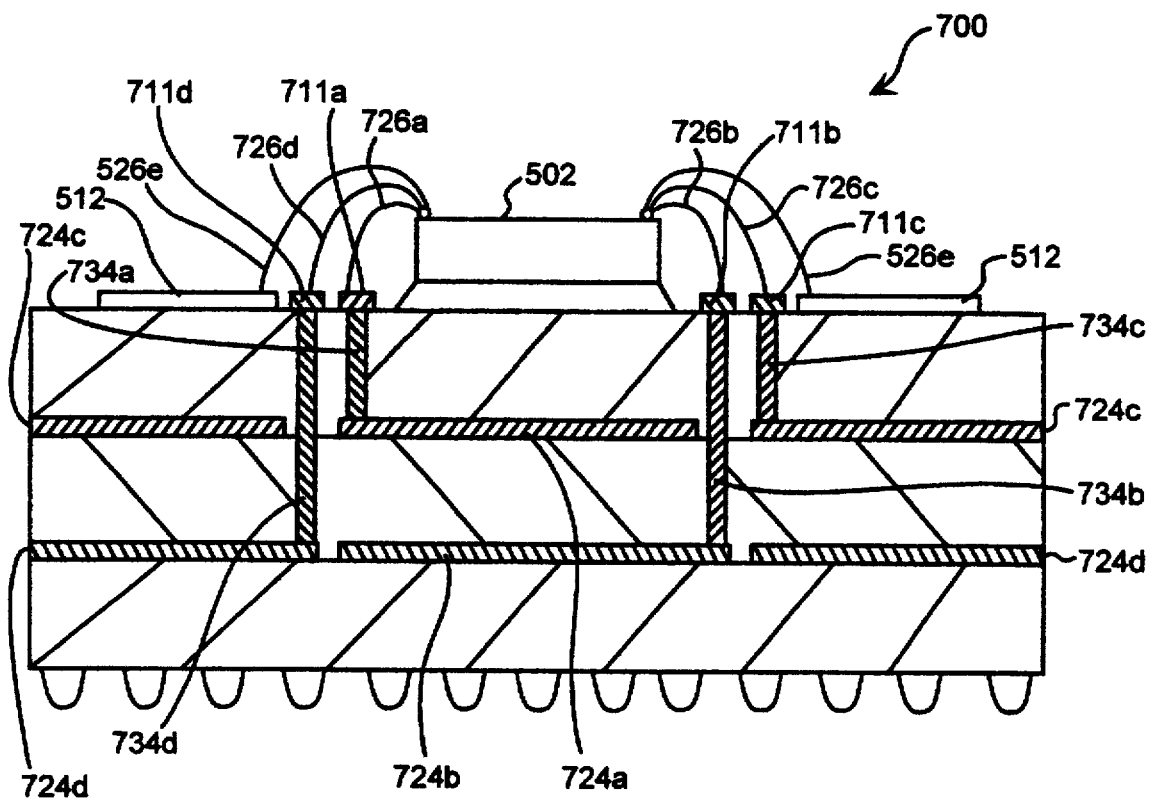
FIG. 7a is a schematic cutaway elevational view of an aspect of the present invention.
Figure 7B:
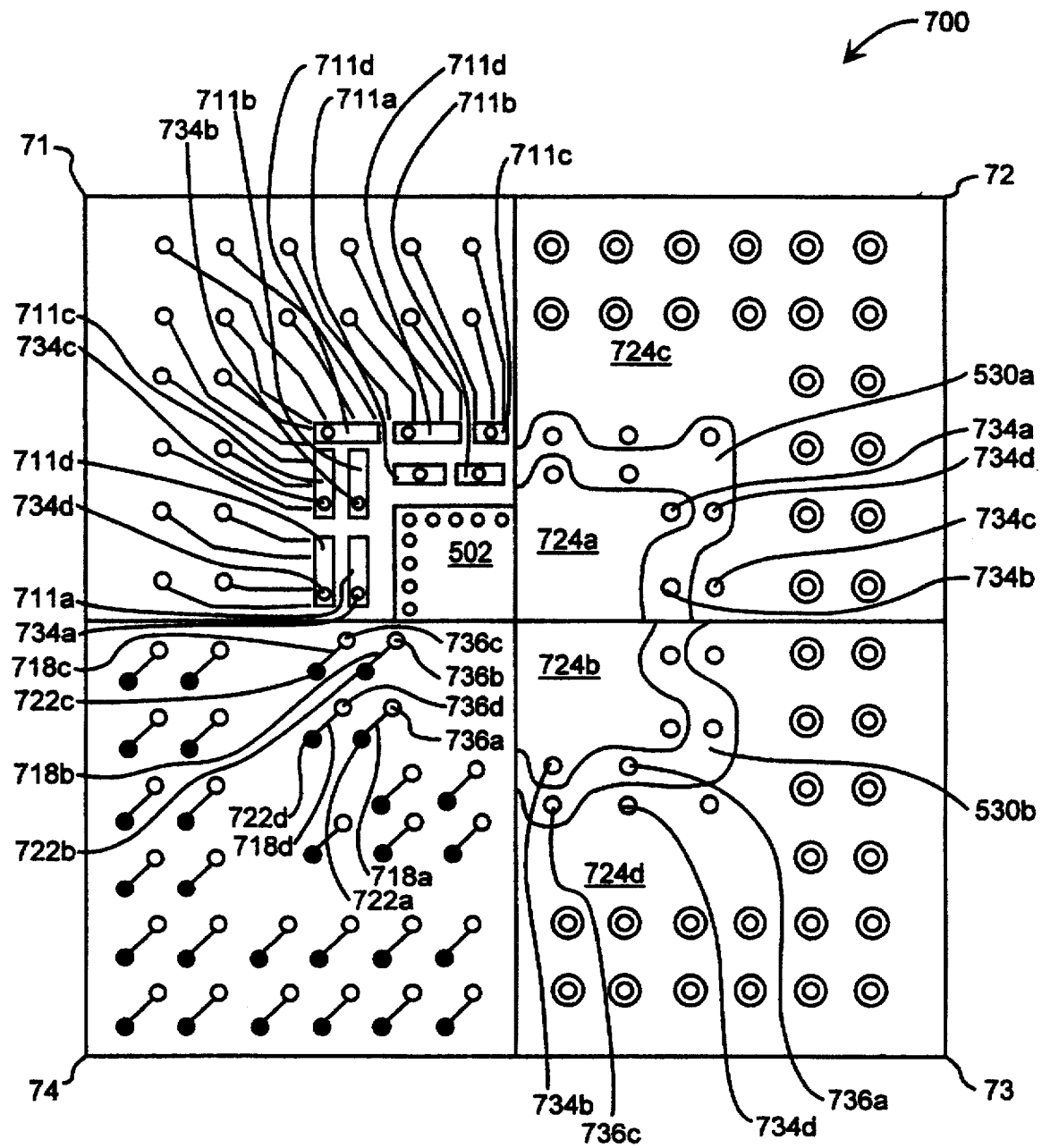
FIG. 7b is a schematic partial cut out plan view of an aspect of the present invention.

Referring now to FIGS. 7a and 7b, another aspect of the present invention is illustrated in schematic cutaway elevational view and schematic partial cut out plan view, respectively. For the purpose of clarity, FIG. 7a does not illustrate bottom vias or signal vias so as to provide an unobstructed view of the present aspect of the invention. FIG. 7b illustrates the present invention in schematic partial cut out plan view where three quadrants 72, 73 and 74 of the semiconductor device assembly 700 have been carved out to successively greater depths (i.e. from the top surface to the bottom surface) for the purpose of illustration. Also, for the purpose of illustration, assume the semiconductor die 502 and the signal pathways (i.e. the signal bond pads 514e, the signal bond wires 526e, the signal top traces 512, the signal vias 538, the signal bottom traces 518e, and the signal external connectors 22e) are the same as illustrated in FIGS. 5a–g and the disclosure thereof.

Here assembly 700 illustrates an alternative configuration of the first, second, third and fourth lands 711a–d. As in assembly 500, the first, second, third, and fourth lands 711a–d are each subdivided into many noncontiguous segments. Unlike assembly 500, the first and second land segments 711a and 711b are selectively arranged into a first single file ring which encircles the semiconductor die 502 (partially illustrated in quadrant 71 in FIG. 7b) and the third and fourth land segments 711c and 711d are selectively arranged into a second single file ring which concentrically encircle the segmented ring of first and second lands 711a and 711b(partially illustrated in quadrant 71 in FIG. 7b) which concentrically encircles the first ring.

The first, second, third, and fourth power bond pads 514a–d on semiconductor 502 are connected to the first, second, third, and fourth land segments 711a–d, respectively, with bond wires 726a–d, respectively. The first, second, third, and fourth land segments 711a–d are connected by top vias 734a–d to the conductive planes 724a–d, respectively, which are further connected by bottom vias 736a–d (not illustrated in FIG. 7a) to the bottom traces 718a–d and external connectors 722a–d, respectively.

Figure 8A:
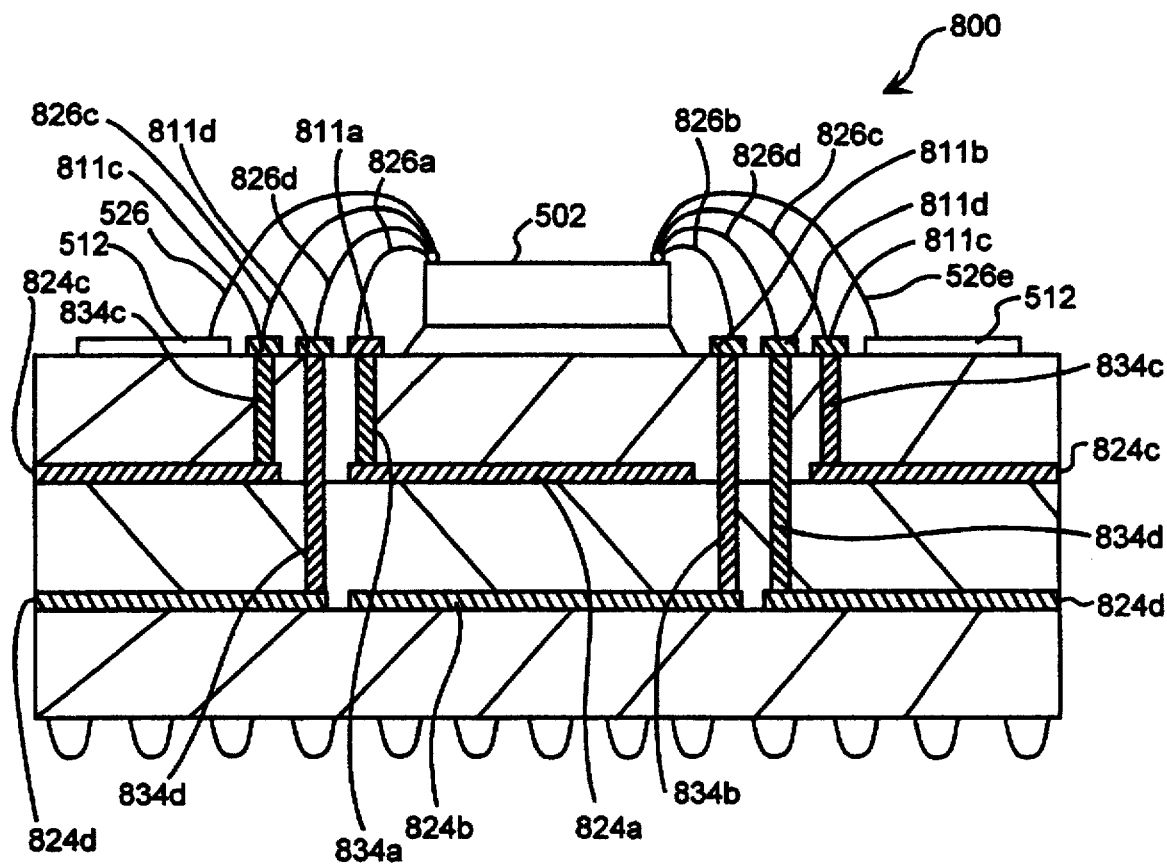
FIG. 8a is a schematic cutaway elevational view of an aspect of the present invention.
Figure 8B:
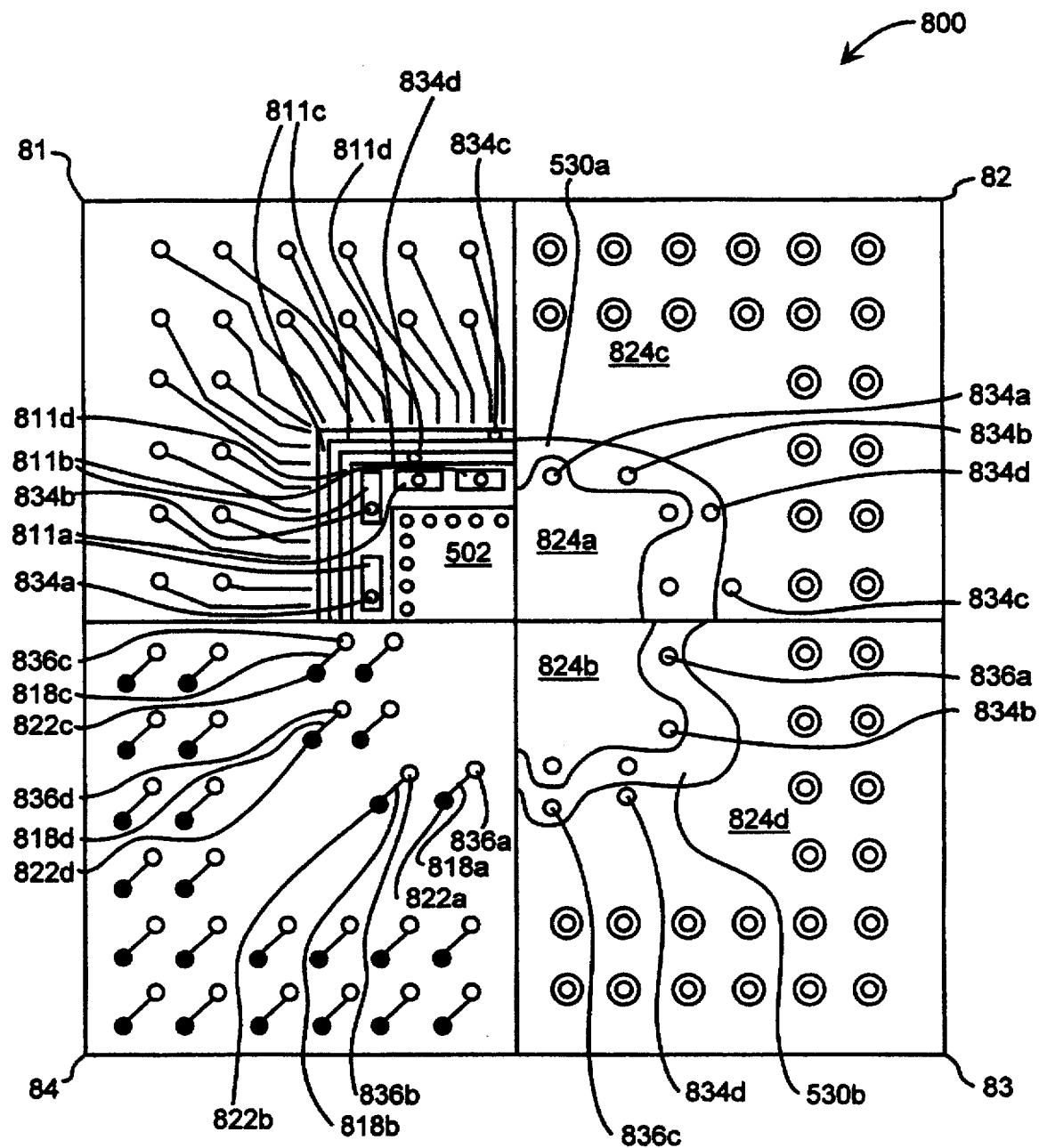
FIG. 8b is a schematic partial cut out plan view of an aspect of the present invention.

Referring now to FIGS. 8a and 8b, yet another aspect of the present invention is illustrated in schematic cutaway elevational view and schematic partial cut out plan view, respectively. For the purpose of clarity, FIG. 8a does not illustrate bottom vias or signal vias so as to provide an unobstructed view of the present aspect of the invention. FIG. 8b illustrates the present invention in schematic partial cut out plan view where three quadrants 82, 83 and 84 of the semiconductor device assembly 800 have been carved out to successively greater depths (i.e. from the top surface to the bottom surface) for the purpose of illustration. For the purpose of illustration, assume the semiconductor die 502 and the signal pathways (i.e. the signal bond pads 514e, the signal bond wires 526e, the signal top traces 512, the signal vias 538, the signal bottom traces 518e, and the signal external connectors 522e) are the same as illustrated in FIGS. 5a–g and the disclosure thereof.

Here assembly 800 illustrates another alternative configuration of the first, second, third and fourth lands 811a–d. As in assembly 700, the first and second lands 811a and 811b are each subdivided into many noncontiguous segments and arranged into a single file segmented ring which encircles the semiconductor die 502 (partially illustrated in quadrant 81 in FIG. 8b). Unlike assembly 700, the third and fourth land segments 811c and 811d are concentric unsegmented rings which further concentrically encircle the segmented ring of first and second lands 811a and 811b (partially illustrated in quadrant 81 in FIG. 8b).

The first, second, third, and fourth power bond pads 514a–d on semiconductor 502 are connected to the first, second, third, and fourth land segments 811a–d, respectively, with bond wires 826a–d, respectively. The first, second, third, and fourth land segments 811a–d are connected by top vias 834a–d to the conductive planes 824a–d, respectively, which are further connected by bottom vias 836a–d (not illustrated in FIG. 8a) to the bottom traces 818a–d and external connectors 822a–d, respectively.

Figure 9A:
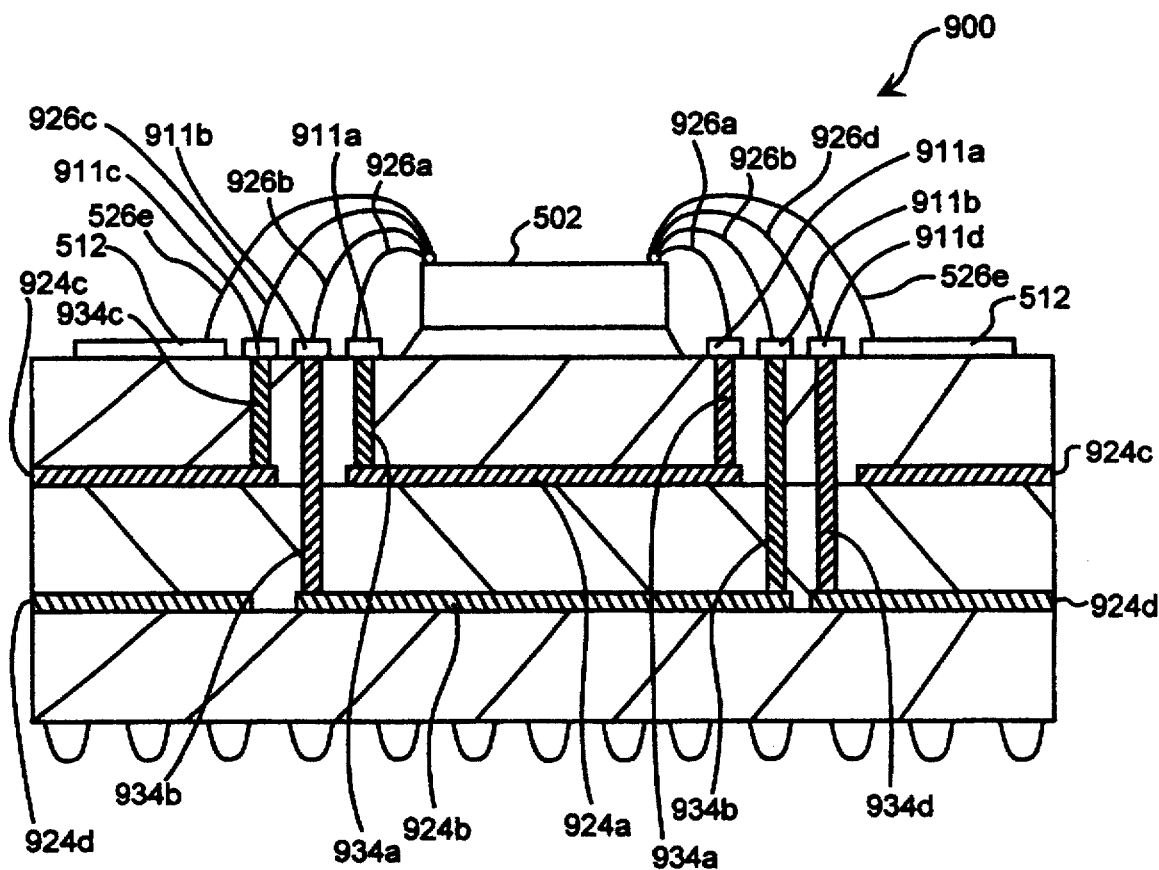
FIG. 9a is a schematic cutaway elevational view of an aspect of the present invention.
Figure 9B:
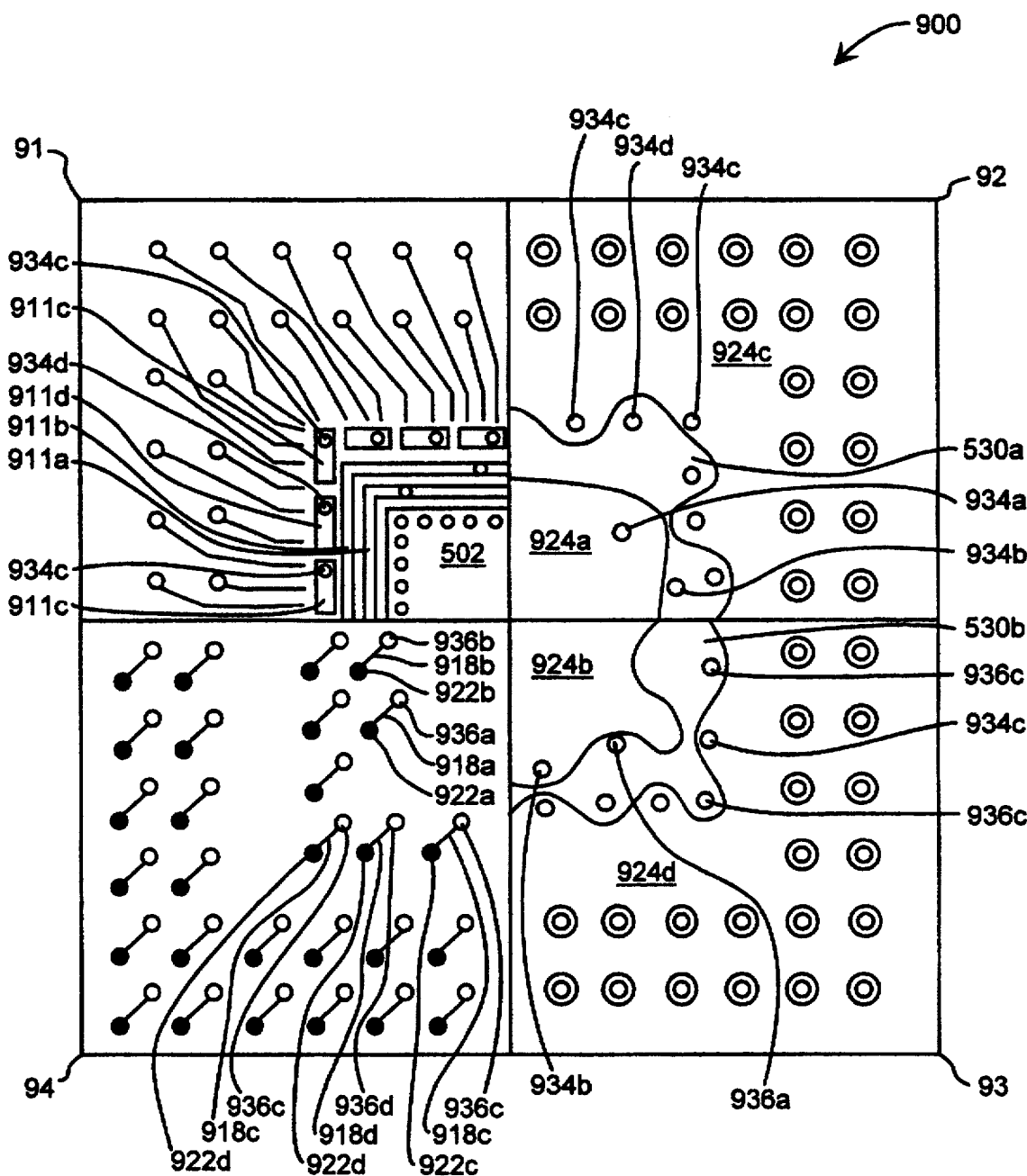
FIG. 9b is a schematic partial cut out plan view of an aspect of the present invention.

Referring now to FIGS. 9a and 9b, another aspect of the present invention is illustrated in schematic cutaway elevational view and schematic partial cut out plan view, respectively. For the purpose of clarity, FIG. 9a does not illustrate bottom vias or signal vias so as to provide an unobstructed view of the present aspect of the invention. FIG. 9b illustrates the present invention in schematic partial cut out plan view where three quadrants 92, 93 and 94 of the semiconductor device assembly 900 have been carved out to successively greater depths (i.e. from the top surface to the bottom surface) for the purpose of illustration. For the purpose of illustration, assume the semiconductor die 502 and the signal pathways (i.e. the signal bond pads 514e, the signal bond wires 526e, the signal top traces 512, the signal vias 538, the signal bottom traces 518e, and the signal external connectors 522e) are the same as illustrated in FIGS. 5a–g and the disclosure thereof.

Assembly 900 illustrates yet another alternative configuration of the first, second, third and fourth lands 911a–d. Here the first and second lands 911a and 911b are two concentric unsegmented rings which encircle the semiconductor die 502 (partially illustrated in quadrant 91 in FIG. 9b). The third and fourth land segments 911c and 911d are each subdivided into many noncontiguous segments and arranged into a single file segmented ring which further concentrically encircles the first and second lands 911a and 911b (partially illustrated in quadrant 91 in FIG. 9b).

The first, second, third, and fourth power bond pads 514a–d on semiconductor 502 are connected to the first, second, third, and fourth land segments 911a–d, respectively, with bond wires 926a–d, respectively. The first, second, third, and fourth land segments 911 a–d are connected by top vias 934a–d to the conductive planes 924a–d, respectively, which are further connected by bottom vias 936a–d (not illustrated in FIG. 9a) to the bottom traces 918a–d and external connectors 922a–d, respectively.

Figure 10A:
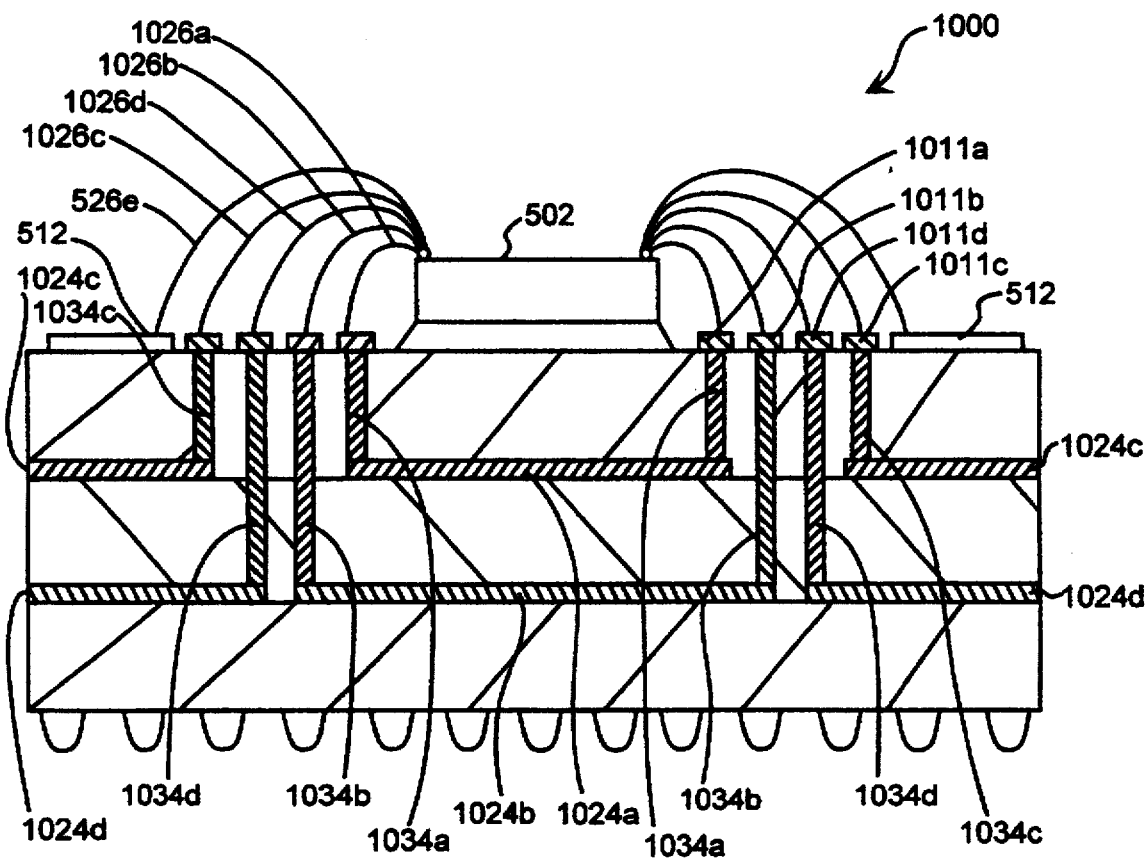
FIG. 10a is a schematic cutaway elevational view of an aspect of the present invention.
Figure 10B:
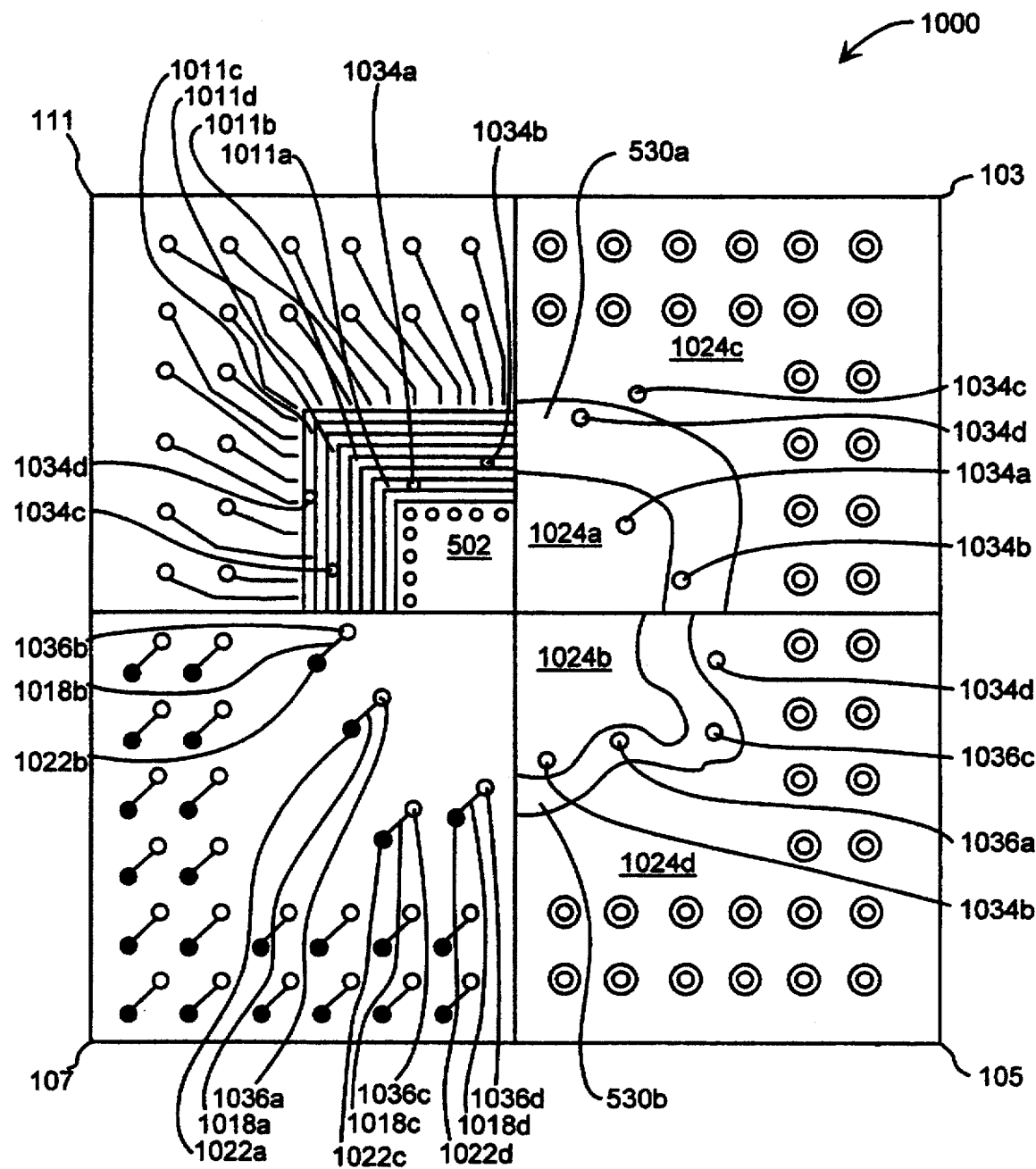
FIG. 10b is a schematic partial cut out plan view of an aspect of the present invention.

Referring now to FIGS. 10a and 10b, another aspect of the present invention is illustrated in schematic cutaway elevational view and schematic partial cut out plan view, respectively. For the purpose of clarity, FIG. 10a does not illustrate bottom vias or signal vias so as to provide an unobstructed view of the present aspect of the invention. FIG. 10b illustrates the present invention in schematic partial cut out plan view where three quadrants 103, 105 and 107 of the semiconductor device assembly 1000 have been carved out to successively greater depths (i.e. from the top surface to the bottom surface) for the purpose of illustration. For the purpose of illustration, assume the semiconductor die 502 and the signal pathways (i.e. the signal bond pads 514e, the signal bond wires 526e, the signal top traces 512, the signal vias 538, the signal bottom traces 518e, and the signal external connectors 522e) are the same as illustrated in FIGS. 5a–g and the disclosure thereof.

Assembly 1000 illustrates still another alternative configuration of the first, second, third and fourth lands 1011a–d. Here the first, second, third and fourth lands 1011a–d are four concentric unsegmented rings which encircle the semiconductor die 502 (partially illustrated in quadrant 101 in FIG. 10b).

The first, second, third, and fourth power bond pads 514a–d on semiconductor 502 are connected to the first, second, third, and fourth land segments 1011a–d, respectively, with bond wires 1026a–d, respectively. The first, second, third, and fourth land segments 1011a–d are connected by top vias 1034a–d to the conductive planes 1024a–d, respectively, which are further connected by bottom vias 1036a–d (not illustrated in FIG. 10a) to the bottom traces 1018a–d and external connectors 1022a–d, respectively.

Although assemblies 500, 700, 800, 900 and 1000 were shown, for the purpose of illustrative clarity, as having substantially square, or rectangular shaped, land ring configurations, whether contiguous or segmented, it is contemplated, and within the spirit of the present invention, that the land ring configurations not be limited to square, or rectangular, shapes.

Assemblies 500, 700, 800, 900 and 1000 all have the common feature of using the area between the semiconductor die 502 and the top signal traces 512 for various configurations of the first, second, third, and fourth lands in one or more rings surrounding the die 502, whether segmented or unsegmented. These configurations all allow shorter bond wires to be used to electrically interconnect the semiconductor die to the package substrate.

The power connections (e.g. bond wires 526a–d, 626a–d, 726a–d, 826a–d, 926a–d, and 1026a–d) are shorter because the first, second, third, and fourth lands can be located extremely close to the semiconductor die 502 because the pitch between the lands is not a problem. Further the first, second, third, and fourth lands (e.g. 511a–d, 711a–d, 811a–d, 911a–d and 1011a–d) may be positioned so as to be proximate to the first, second, third, and fourth power bond pads 514a–d.

Because the power bond wires are shorter, and because the bond wires connect to the lands, rather than the traces, the electrical connection between the first, second, third, and fourth power bond pads 514a–d and the first, second, third, and fourth conductive planes (e.g. 524a–d, 724a–d, 824a–d, 924a–d and 1024a–d) are considerably shorter and therefore have lower impedance than connections utilizing traces.

The signal bond wires may also be shorter using the present invention. Because all of the power connections are formed using the lands, and not the traces, the number of traces on the package substrate is reduced. Because the number of traces and the trace pitch determine how close the traces may be placed proximate to the semiconductor die, the reduced number of these traces allows the traces to be extended closer to the semiconductor die, thereby reducing the lengths of the bond wires necessary to connect the signal bond pads 514e to signal traces 512.

By allowing shorter bond wires to be used, the present invention increases manufacturing yields by reducing the number of semiconductor device assemblies which prematurely fail due to bond wires shorting or breaking.

Figure 11A:
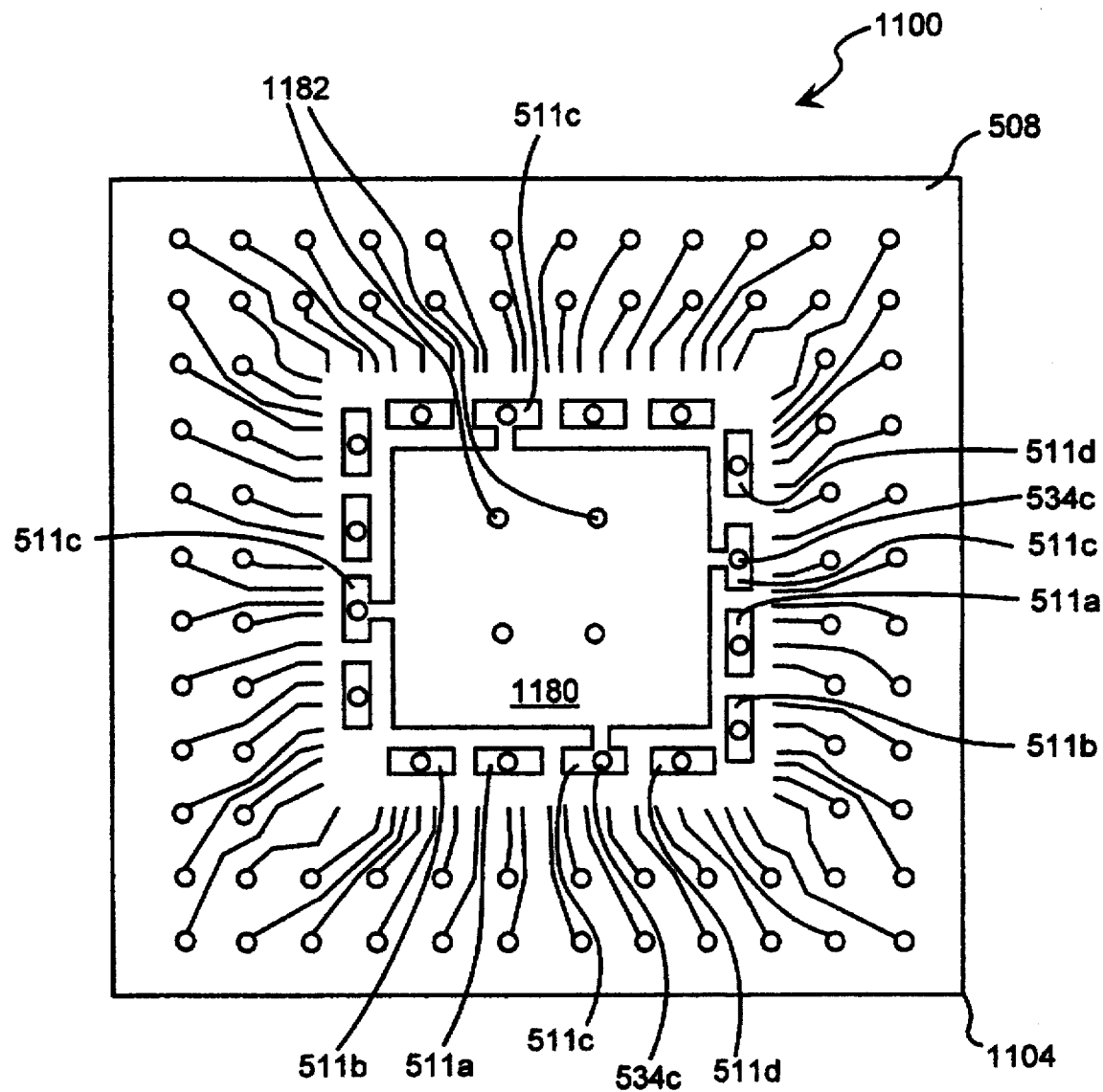
FIG. 11a is a schematic plan view of an aspect of the present invention.
Figure 11B:
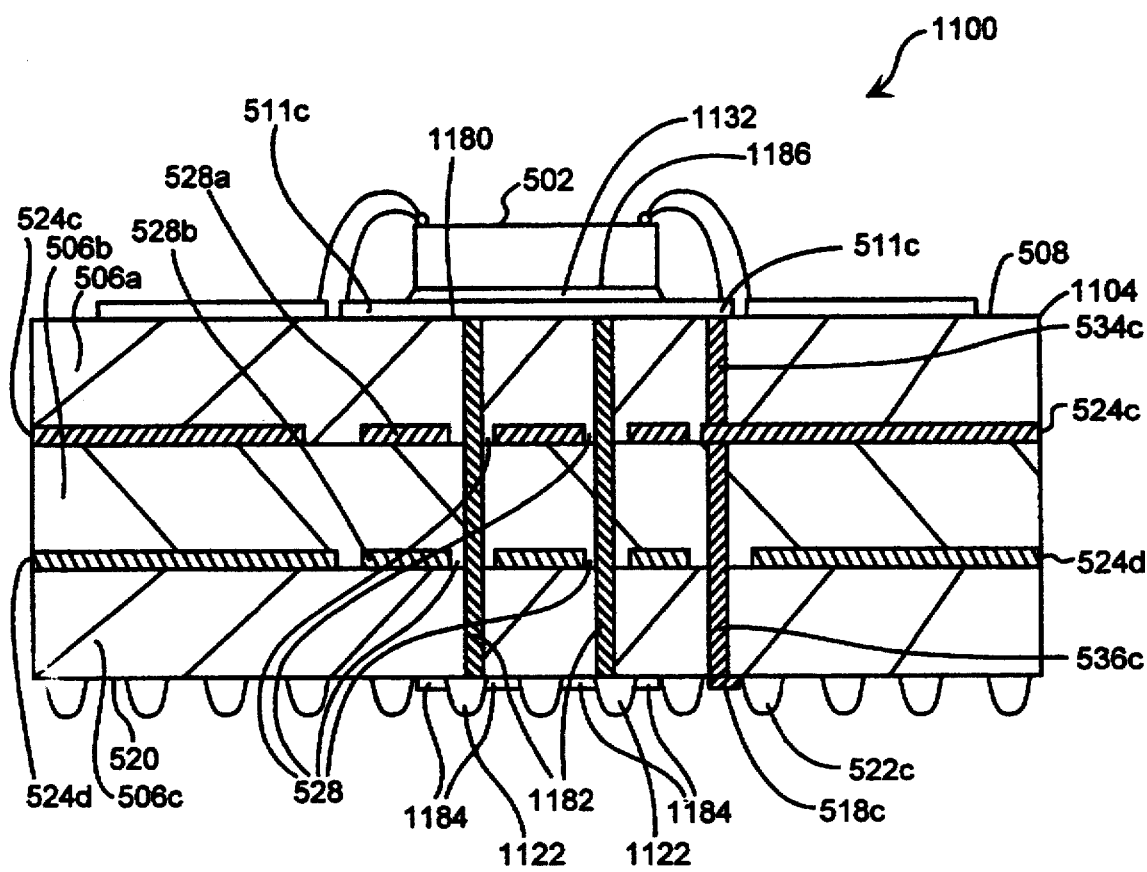
FIG. 11b is a schematic cutaway elevational view of an aspect of the present invention.

Referring now to FIGS. 11a and 11b, another aspect of the present invention is illustrated in schematic plan view and schematic cutaway elevational view, respectively. For the purpose of illustration, assume the die (only illustrated in FIG. 11b), bond pads (only illustrated in FIG. 11b), bond wires (only illustrated in FIG.11b), land segments, signal top traces, top vias, bottom vias, signal vias, dielectric layers, bottom traces, and external connectors in assembly 600 are identical to the die 502, bond pads 514a–e, bond wires 526a–e, land segments 511a–d, signal top traces 512, top vias 534a–d, bottom vias 536a–d, signal vias 538, dielectric layers 506a–c, bottom traces 518a–e, and external connectors 522a–e in assembly 500 (as illustrated in FIGS. 5a through 5g).

Assembly 1100 illustrates a grounded die paddle 1180 which is electrically and thermally conductive. The die paddle 1180 may be fabricated from copper alloys, gold alloys, aluminum alloys or the like. The die paddle 1180 generally defines the die receiving area on the top surface 508 of the package substrate 1104. The inactive face 1186 of semiconductor die 502 may be affixed to the die paddle 1180 using a thermally conductive adhesive 1132 such as epoxy or the like.

The die paddle may be selectively attached to a single unsegmented land ring (not illustrated) or to one or more segments of the same land, such as land segments 511c. For the purposes of illustration, and not by limitation, FIGS. 11a and 11b show the die paddle 1180 connected to the land segments 511c, however, the die paddle may be selectively connected to any one land, or land segments, such as 511a, 511b, or 511d, so long as the die paddle does not connect two or more different lands or land segments, such as to both 511b and 511c.

By connecting the die paddle 1180 to land segments 511c, heat generated by the semiconductor die 502 may be thermally conducted from the die 502, through the thermally conductive adhesive 1132, through the die paddle 1180 to the land segments 511c. The heat may then be conducted from the land segments 511c, through the top vias 534c to the conductive plane 524c, where some of the heat may be dissipated to the package substrate dielectric layers 506a and 506b which act as heat sinks.

The heat may also be conducted from the conductive plane 524c to the bottom vias 536c, the bottom traces 518c, and the external connectors 522c. Here the heat may be radiated, conducted, or convected to the ambient environment which acts as a heat sink, or further conducted to an external system, which acts as a heat sink, connected to the external connectors 522c.

In combination with the foregoing, or as an alternative to the foregoing, thermal vias 1182 may pass from the top surface 508 to the bottom surface 520, by passing through electrically insulating hole 528 in conductive planes 524a and 524b. The thermal vias 1182 thermally connect to the die paddle 1180 and the bottom surface 520 of the package substrate 504. The thermal vias 1182 may terminate in a thermally conductive radiator 1184 and/or thermal external connectors 1122. The thermally conductive radiator 1184, which acts as a heat sink, may dissipate the heat to the ambient environment by radiation, conduction, or convection. The thermal external connectors 1122 may dissipate the heat by conduction to an external system, which acts as a heat sink, connected to the thermal external connectors 1122.

Other and further objects, features and advantages will be apparent from the following description of the presently preferred embodiments of the invention, given for the purpose of disclosure and taken in conjunction with the accompanying drawings.

The present invention, therefore, is well adapted to carry out the objects and attain the ends and advantages mentioned, as well as others inherent therein. While presently preferred and most preferred embodiments of the invention have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A package substrate for a semiconductor die having core circuits, input-output circuits, a first plurality and a second plurality of power bond pads for the core circuits, a third plurality and a fourth plurality of power bond pads for the input-output circuits, and a plurality of signal bond pads, the package substrate comprising:

a top surface, a bottom surface, first and second conductive patterns, and first, second and third dielectric layers;

the first dielectric layer disposed between the top surface and the first conductive pattern, the second dielectric layer disposed between the first and second conductive patterns, and the third dielectric layer disposed between the second conductive pattern and the bottom surface;

the top surface having a first land for connecting to the first plurality of power bond pads, a second land for connecting to the second plurality of power bond pads, a third land for connecting to the third plurality of power bond pads, a fourth land for connecting to the fourth plurality of power bond pads, and a plurality of traces for connecting to the plurality of signal bond pads;

the bottom surface having a plurality of first external connectors, a plurality of second external connectors, a plurality of third external connectors, a plurality of fourth external connectors, and a plurality of signal external connectors;

the first conductive pattern having a first plane and a third plane, the first plane connected to the first land and the plurality of first external connectors, and the third plane connected to the third land and the plurality of third external connectors;

the second conductive pattern having a second plane and a fourth plane, the second plane connected to the second land and the plurality of second external connectors, and the fourth plane connected to the fourth land and the plurality of fourth external connectors, the first and second planes positioned in a biplanar relationship for forming an electrical capacitance, and the third and fourth planes positioned in a biplanar relationship for forming an electrical capacitance thereby decoupling the core circuits of said semiconductor die from the input-output circuits of said semiconductor die; and the plurality of signal traces connected to the plurality of signal external connectors.

2. The package substrate according to claim 1 wherein the first land is a first plurality of segments, the second land is a second plurality of segments, the third land is a third plurality of segments and the fourth land is a fourth plurality of segments, the first, second, third and fourth plurality of segments arranged in a segmented ring, and the die receiving area surrounded by the segmented ring.

3. The package substrate according to claim 1 wherein the first land is a first plurality of segments and the second land is a second plurality of segments, the first and second plurality of segments arranged in a first segmented ring, the die receiving area surrounded by the first segmented ring, and the third land is a third plurality of segments and the fourth land is a fourth plurality of segments, the third and fourth plurality of segments arranged in a second segmented ring, the first segmented ring concentrically surrounded by the second segmented ring.

4. The package substrate according to claim 1 wherein the first land is a first plurality of segments and the second land is a second plurality of segments, the first and second plurality of segments arranged in a segmented ring, the die receiving area surrounded by the segmented ring, and the third land and the fourth land are two concentric rings, the segmented ring concentrically surrounded by the two concentric rings.

5. The package substrate according to claim 1 wherein the first land and the second land are two concentric rings, the die receiving area surrounded by the two concentric rings, and the third land is a first plurality of segments and the fourth land is a second plurality of segments, the first and second plurality of segments arranged in a segmented ring, the two concentric rings concentrically surrounded by the segmented ring.

6. The package substrate according to claim 1 wherein the first land and the second land are two concentric rings, the die receiving area surrounded by the two concentric rings, and the third land and the fourth land are an other two concentric rings, the first land and the second land concentrically surrounded by the third land and the fourth land.

7. The package substrate according to claim 1 further comprising:

at least one thermal via, the at least one thermal via having one end and an other end, the one end located on the top surface of the package substrate in the die receiving area, the one end adapted to thermally connect to said semiconductor die, and the other end located on the bottom surface of the package substrate, the other end adapted for connection to a thermal sink.

8. The package substrate according to claim 1 wherein the first, second and third dielectric layers of said package substrate are epoxy.

9. The package substrate according to claim 1 wherein the first, second and third dielectric layers of said package substrate are polyimide.

10. The package substrate according to claim 1 wherein the first, second and third dielectric layers of said package substrate are fiberglass reinforced plastic.

11. The package substrate according to claim 1 wherein the first, second and third dielectric layers of said package substrate are ceramic.

12. The package substrate according to claim 1 wherein the external connectors are pins.

13. The package substrate according to claim 1 wherein the external connectors are solder ball bumps.

14. The package substrate according to claim 1 wherein the third plane encircles the first plane, and the fourth plane encircles the second plane.

15. A semiconductor device assembly, comprising:

a package substrate comprising:

a top surface, a bottom surface, first and second conductive patterns, and first, second and third dielectric layers;

the top surface having a die receiving area, the die receiving area surrounded by a land area, and the land area surrounded by a trace area, the land area having a first land, a second land, a third land, and a fourth land, and the trace area having a plurality of traces;

the bottom surface having a plurality of first external connectors, a plurality of second external connectors, a plurality of third external connectors, a plurality of fourth external connectors, and a plurality of signal external connectors, the plurality of signal external connectors connecting to the plurality of traces;

the first dielectric layer disposed between the top surface and the first conductive pattern, the second dielectric layer disposed between the first and second conductive patterns, and the third dielectric layer disposed between the second conductive pattern and the bottom surface;

the first conductive pattern having a first plane and a third plane, the first plane connected to the first land and the plurality of first external connectors, and the third plane connected to the third land and the plurality of third external connectors;

the second conductive pattern having a second plane and a fourth plane, the second plane connected to the second land and the plurality of second external connectors, and the fourth plane connected to the fourth land and the plurality of fourth external connectors, the first and second planes positioned in a biplanar relationship for forming an electrical capacitance, and the third and fourth planes positioned in a biplanar relationship for forming an electrical capacitance; and a semiconductor die having core circuits and input-output circuits, said semiconductor die located in the die receiving area on the top surface of said package substrate, said semiconductor die comprising:

a plurality of first power bond pads for the core circuits, the plurality of first power bond pads connected to the first land;

a plurality of second power bond pads for the core circuits, the plurality of second power bond pads connected to the second land;

a plurality of third power bond pads for the input-output circuits, the plurality of third power bond pads connected to the third land;

a plurality of fourth power bond pads for the input-output circuits, the plurality of fourth power bond pads connected to the fourth land, thereby decoupling the core circuits of said semiconductor die from the input-output circuits of said semiconductor die; and a plurality of signal bond pads, the plurality of signal bond pads connected to the plurality of traces of said package substrate.

16. The semiconductor device assembly according to claim 15 wherein the first land is a first plurality of segments, the second land is a second plurality of segments, the third land is a third plurality of segments and the fourth land is a fourth plurality of segments, the first, second, third and fourth plurality of segments arranged in a segmented ring, and the die receiving area surrounded by the segmented ring.

17. The semiconductor device assembly according to claim 15 wherein the first land is a first plurality of segments and the second land is a second plurality of segments, the first and second plurality of segments arranged in a first segmented ring, the die receiving area surrounded by the first segmented ring, and the third land is a third plurality of segments and the fourth land is a fourth plurality of segments, the third and fourth plurality of segments arranged in a second segmented ring, the first segmented ring concentrically surrounded by the second segmented ring.

18. The semiconductor device assembly according to claim 15 wherein the first land is a first plurality of segments and the second land is a second plurality of segments, the first and second plurality of segments arranged in a segmented ring, the die receiving area surrounded by the segmented ring, and the third land and the fourth land are two concentric rings, the segmented ring concentrically surrounded by the two concentric rings.

19. The semiconductor device assembly according to claim 15 wherein the first land and the second land are two concentric rings, the die receiving area surrounded by the two concentric rings, and the third land is a first plurality of segments and the fourth land is a second plurality of segments, the first and second plurality of segments arranged in a segmented ring, the two concentric rings concentrically surrounded by the segmented ring.

20. The semiconductor device assembly according to claim 15 wherein the first land and the second land are two concentric rings, the die receiving area surrounded by the two concentric rings, and the third land and the fourth land are an other two concentric rings, the first land and the second land concentrically surrounded by the third land and the fourth land.

21. The semiconductor device assembly according to claim 15 further comprising:

at least one thermal via, the at least one thermal via having one end and an other end, the one end located on the top surface of the package substrate in the die receiving area, and the other end located on the bottom surface of the package substrate, the other end adapted for connection to a thermal sink; and a thermally conductive epoxy disposed between the semiconductor die and the one end of the at least one thermal via for conducting heat generated by the semiconductor die to the other end adapted for connection to a thermal sink.

* * * * *